(12) United States Patent
Endo et al.

(10) Patent No.: US 6,348,650 B1
(45) Date of Patent: Feb. 19, 2002

(54) THERMOPILE INFRARED SENSOR AND PROCESS FOR PRODUCING THE SAME

(75) Inventors: Haruyuki Endo; Takeshi Fuse; Tadashi Matsudate; Yasutaka Tanaka; Toshikazu Okada, all of Tokyo (JP)

(73) Assignee: Ishizuka Electronics Corporation, Tokyo (JP)

( * ) Notice: Subject to any disclaimer, the term of this patent is extended or adjusted under 35 U.S.C. 154(b) by 0 days.

(21) Appl. No.: 09/534,045

(22) Filed: Mar. 24, 2000

(30) Foreign Application Priority Data

Mar. 24, 1999 (JP) .............................. 11-079052

(51) Int. Cl.[7] .............................................. H01L 35/34
(52) U.S. Cl. ........................ 136/201; 136/224; 136/208
(58) Field of Search ................................ 136/201, 225, 136/208, 230; 204/192.17, 192.23, 192.25; 438/54; 427/58

(56) References Cited

U.S. PATENT DOCUMENTS

| | | | |
|---|---|---|---|
| 4,111,717 A | 9/1978 | Baxter | 136/225 |
| 4,665,276 A | 5/1987 | Elbel et al. | 136/215 |
| 5,100,479 A | * 3/1992 | Wise et al. | 136/225 |

FOREIGN PATENT DOCUMENTS

| | | |
|---|---|---|
| DE | 4221037 C2 | 1/1994 |
| JP | 49-73986 | 7/1974 |
| JP | 53-132282 | 11/1978 |
| JP | 59-94023 | 5/1984 |
| JP | 64-8644 | 1/1989 |
| JP | 3-191834 | 8/1991 |
| JP | 4-43783 | 10/1992 |

OTHER PUBLICATIONS

"A Batch–Fabricated Silicon Thermopile Infrared Detector", G.R. Lahiji et al., IEEE Transactions on Electron Devices, vol. ED–29, No. 1, Jan. 1982, pp. 14–22.
"Thermopiles Fabricated using Silicon Planar Technology", G.D. Nieveld, Sensors and Actuators, 3 (1982/83), pp. 179–183, No month provided.
"High Sensitivity and Detectivity Radiation Thermopiles Made by Multi–Layer Technology", F. Völklein et al., Sensors and Actuators A, 24 (1990), pp. 1–4, No month provided.

* cited by examiner

*Primary Examiner*—Kathryn Gorgos
*Assistant Examiner*—Thomas H Parsons
(74) *Attorney, Agent, or Firm*—McDermott, Will & Emery

(57) ABSTRACT

An improved thermopile infrared sensor is provided wherein thermoelectric elements are formed on a single crystalline silicon substrate containing a cavity therein. The thermopile infrared sensor contains a first dielectric film covering the cavity, a plurality of n-type polycrystalline silicon layers formed on the first dielectric film, extending radially from the vicinity of a chip center, and metal film layers formed in contact with the n-type polycrystalline silicon layers, wherein hot junctions are formed at the chip central side and cold junctions are formed at the chip peripheral side of the n-type polycrystalline silicon layers, respectively, by contacting the n-type polycrystalline silicon layer and the metal film layer, and at least one series of thermoelectric elements is formed on the first dielectric film by connecting alternately and successively, by the metal film layer, the hot junction and cold junction of the neighboring n-type polycrystalline silicon layer.

28 Claims, 21 Drawing Sheets

(1 of 21 Drawing Sheet(s) Filed in Color)

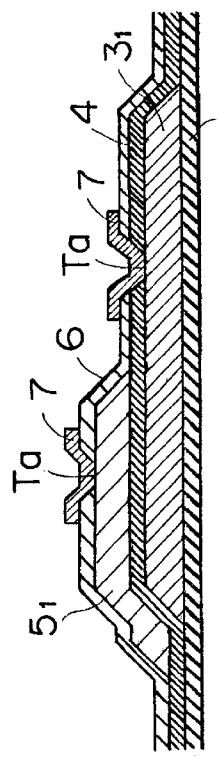
F I G. 1 3 A
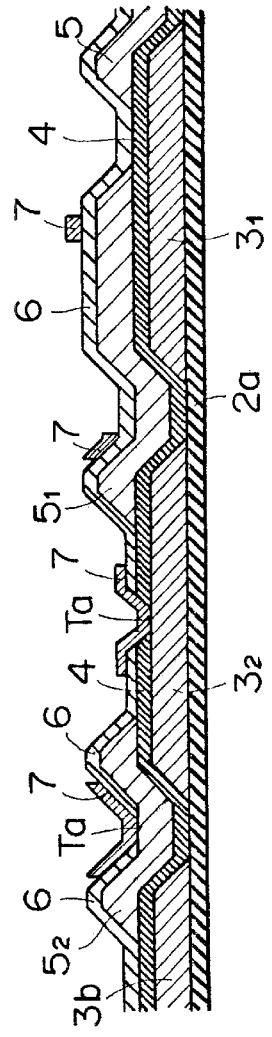
F I G. 1 3 B
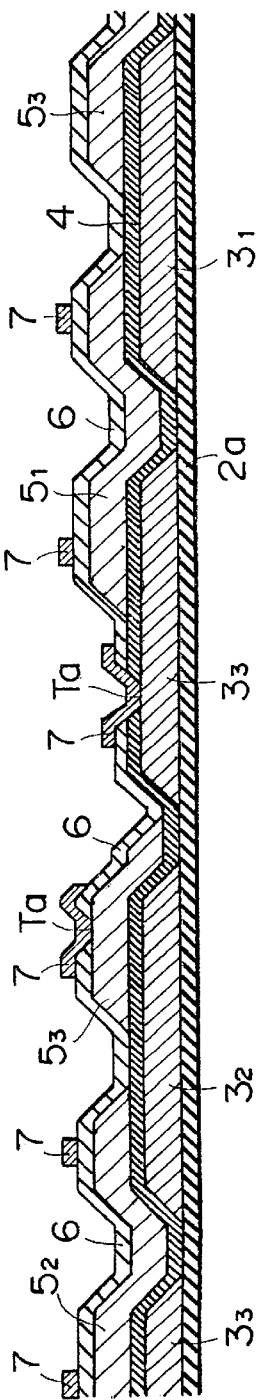
F I G. 1 3 C

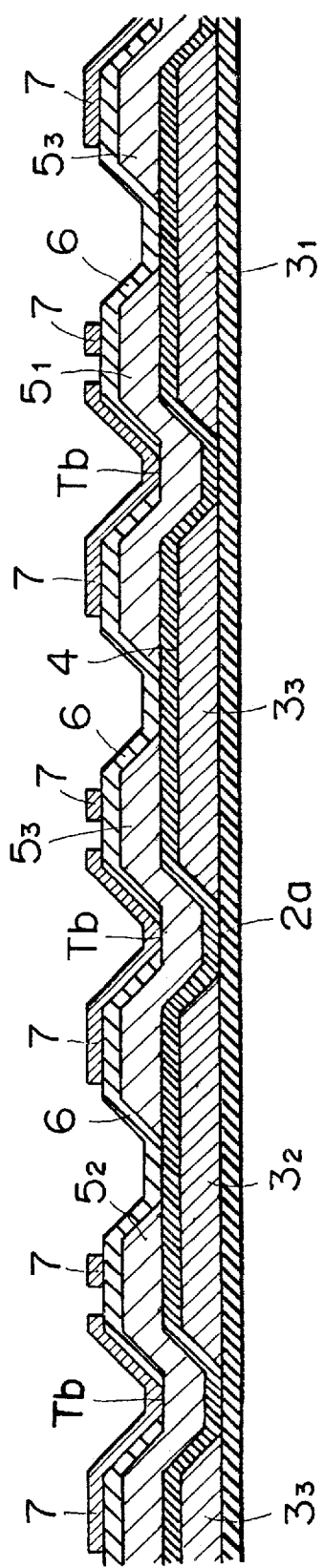
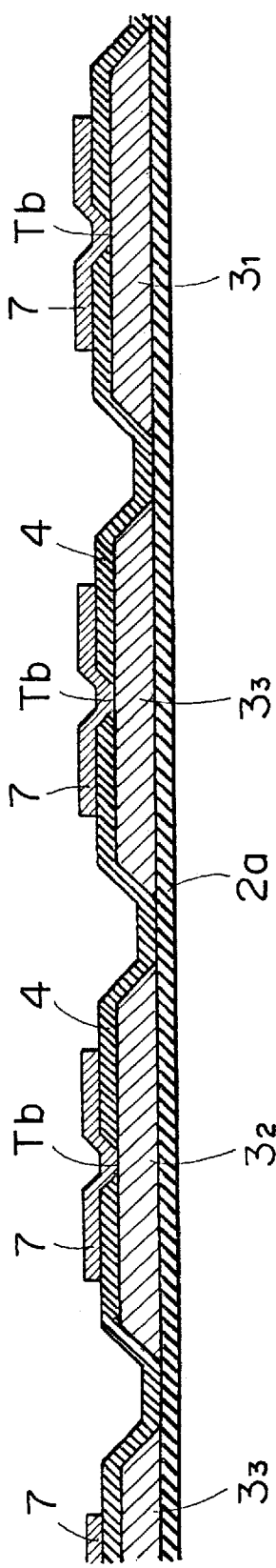
FIG. 14A
FIG. 14B

THERMOPILE INFRARED SENSOR AND PROCESS FOR PRODUCING THE SAME

BACKGROUND OF THE INVENTION

(1) Field of the Invention

This invention relates to a thermopile-type infrared sensor and a process for producing the same and, more specifically, to a thermopile-type infrared sensor that increases a S/N ratio by improving a thermopile pattern structure thereof and a process for producing the same, which enhances production yield thereof.

(2) Description of the Related Art

In general, a thermal equilibrium equation for a thermal infrared sensor is expressed as follows:

$$C \cdot \delta T/dt + G \cdot \delta T = W \quad (1)$$

where, C is a heat capacity, $\delta T$ is a temperature change of a light-receiving part, G is a thermal conductance between the light-receiving part and the surroundings, and W is light-receiving power. When the light-receiving power W varies according to an equation $W = W_0 \exp(j\omega t)$, $\delta T$ is expressed as follows:

$$|\delta T| = W_0/G(1+\tau^2\omega^2)^{1/2} \quad (2)$$

wherein a thermal time constant $\tau$ is expressed as follows:

$$\tau = C/G \quad (3)$$

Accordingly, in order to increase a response rate of a thermal infrared sensor (i.e. to decrease thermal time constant $\tau$), heat capacity C is needed to be decreased and thermal conductance G is needed to be increased. However, an increase in G causes temperature change of light-receiving part $\delta T$ to decrease with respect to the same light-receiving power and sensitivity to deteriorate. Therefore, in order to improve sensitivity and response rate of a thermal infrared sensor, G is needed to be small and C is needed to be decreased. From this point of view, a heat-sensitive part, in which a hot junction is placed, is constructed to have a membrane structure of several microns thickness so that the heat capacity C and thermal conductance G in relation to a substrate decrease, resulting in improvement in sensitivity and response rate of a thermopile-type thermal infrared sensor.

A figure of merit Z for a thermoelectric element such as a thermopile is expressed as follows:

$$Z = \alpha^2 \cdot \sigma/\lambda \, m^{*3/2}(\mu/\lambda_L) \quad (4)$$

where, $\alpha$ is the Seebeck coefficient, a electrical conductivity, $\lambda_L$ is thermal conductivity, $m^*$ is effective mass, $\mu$ is mobility of carrier, and $\lambda_L$ is thermal conductivity of lattice.

Accordingly, in order to improve electrical characteristics of a thermoelectric element, Seebeck coefficient $\alpha$ and electrical conductivity a are needed to be increased while thermal conductivity $\lambda$ is needed to be decreased. Therefore, a semiconductive material having a large figure of merit Z compared to metal is employed as a thermoelectric material.

On the other hand, a Seebeck coefficient $\alpha$ of n-type silicon as a thermoelectric material is expressed as follows:

$$\alpha = (V_F/T + 2k/q) \quad (5)$$

wherein $V_F$ is energy difference between a bottom of conduction band and Fermi level, T is absolute temperature, k is the Boltzmann's constant, and q is electron charge.

The relation between $V_F$ and electrical conductivity $\sigma$ is expressed as follows:

$$\sigma = q \cdot n \quad (6)$$

where, n is number of carriers and $\mu$ mobility of carrier.

$$n = N_c \exp(V_F/kT) \quad (7)$$

wherein $N_c$ is effective density of states (quoted from "semiconductor device" written by S. M. Sze).

Consequently, electrical conductivity is expressed as follows:

$$\sigma = q \cdot N_c \cdot \mu \exp(V_F/kT) \quad (8)$$

According to equation (8), there is a trade-off relation between a and $\sigma$. That is, when $V_F$ is increased for attempting to increase Seebeck coefficient $\alpha$, the number of carriers n is decreased, causing $\sigma$ to decrease. Thermal conductivity $\lambda$ of single crystalline silicon markedly depends upon thermal conductivity of lattice, which is very high because silicon atoms are bonded by covalent bonding with each other. Thermal conductivity of lattice decreases with decreasing crystallinity of a crystal such as polycrystalline silicone, in which $\mu$ also decreases, causing a to decrease. Consequently, performance parameters of thermoelectric material are parameters such as impurity concentration, crystallinity, size of thermoelectric element, and number of thermopiles, for which the most suitable design is required.

As a conventional example No. 1 of a thermopile, a thermopile attempted to be highly sensitive, produced by a process containing: laminating thin films of $SiO_2$ and SiN on a single crystalline silicon substrate by using semiconductor photolithography processing technology; employing a combination of p-type polycrystalline silicon-Au/Cr and n-type polycrystalline silicon-Au/Cr as a thermoelectric material; and forming hollow portions by anisotropic etching of the substrate using Ethylene Diamine Pyrocatechol (EDP) so as to allow a heat-sensitive part to have a membrane structure, is reported ("A Silicon-Thermopile-Based Infrared Sensing Array for Use in Automated Manufacturing", IEEE Trans. Electron Devices, vol. ED-33 No. 1, pp 72–79, 1986).

In FIG. 21, there is shown a conventional example No. 2 of a thermopile attempted to be highly sensitive, which is disclosed in Japanese Patent Application Laid-Open No. H3-191834. This thermopile is produced by a process containing the steps of: forming an epitaxial layer 21 on a single crystalline silicon substrate 20; forming a thermopile material of p-type diffusion layers 22 in the epitaxial layer 21; forming a thermopile material of n-type polycrystalline silicon layers 24 thereon through an insertion of insulator 23; and connecting with the polycrystalline silicon layers 24 by forming an aluminum layer 25, thereby constructing a multiple layers-thermopile structure consisting of single crystalline silicon-aluminum-polycrystalline silicon. This is a thermopile, in which multiple layers of thermopile material are constructed so as to increase the number of thermopiles per unit area, thereby attempting to achieve high output and chip size miniaturization.

However, the above conventional thermopiles have problems as explained in the following. In the conventional example No. 1 of thermopile, thin films of $SiO_2$ and SiN are laminated on a single crystalline silicon substrate, and Au/Cr and polycrystalline silicon having a large Seebeck coefficient are employed as thermoelectric material. Since Au has high thermal conductivity, dissipating of absorbed heat is large, resulting in an insufficient ratio of temperature rise at the light-receiving part. Accordingly, the problem is that sufficient temperature rise cannot be obtained.

Further, a p-type polycrystalline silicon is used as a thermoelectric material, in which the majority carrier, i.e. hole has low mobility, causing high electrical resistivity. Consequently, S/N ratio, i.e. ratio of output voltage to Johnson noise becomes low, causing the thermopile to have inferior accuracy when used as a noncontacting temperature sensor. Further, since a pattern of polycrystalline silicon thermoelectric material is not arranged over a whole thin membrane part, bends and cracks are easily occurred in the film upon an anisotropic etching, causing a problem of deterioration in the yield.

On the other hand, the conventional example No. 2 of thermopile has tried to solve the above problem of the conventional example No. 1 and also to achieve higher sensitivity. Single crystalline and polycrystalline silicon are employed as the thermoelectric material, each of which is formed as a p-type and n-type semiconductor, respectively, and then, electromotive force polarity of which is set up to be reverse with each other, attempting to achieve higher sensitivity. However, since the thermopile employs a p-type diffusion layer formed on a surface of single crystalline silicon substrate as one of the thermoelectric materials thereof, it has been needed to leave a single crystalline silicon and an epitaxial layer having thickness of 5 μm or over including a thickness of the p-type diffusion layer.

Seebeck coefficient of single crystalline silicon can be enlarged by controlling impurity concentration and thermal conductivity thereof is higher compared to the other materials. Consequently, even if a thickness thereof is thin as small as 10 μm, a thermal insulation between a hot junction in a heat-sensitive part consisting of an absorbing film and a cold junction formed on the substrate is inferior, causing insufficient temperature rise per unit of infrared incident power at the heat-sensitive part, resulting in that the output voltage becomes low.

Further, even if the p-type and n-type polycrystalline silicon are employed as the thermoelectric material so as to increase an apparent electromotive force, a hole that is a majority carrier in the p-type polycrystalline silicon layer has high resistivity caused by low mobility compared to that of an electron, resulting in a low S/N ratio, i.e. low ratio of output voltage to Johnson noise compared to that of n-type silicon, and causing the thermopile to have inferior accuracy when used as a noncontacting temperature sensor as well as the conventional example No. 1.

Furthermore, since a pattern of polycrystalline silicon is not arranged over a whole thin film membrane part, a crack is easily occurred in the film caused by concentration of stress upon an anisotropic etching, causing a problem of deterioration in the yield. In addition, since a suitable control of the impurity concentration has not been disclosed, a sufficient S/N ratio cannot be obtained for use in the thermopile sensor.

SUMMARY OF THE INVENTION

It is therefore an object of the present invention to solve the above problems and to provide an inexpensive thermopile-type infrared sensor, in which the S/N ratio, i.e. ratio of output voltage to Johnson noise, is increased, a flat and rigid membrane structure is formed therein, and an absorption characteristic as well as a production yield thereof are improved, and to provide a process for producing such a thermopile-type infrared sensor.

In order to accomplish the above object, a first aspect of the present invention is to provide a thermopile-type infrared sensor, in which thermoelectric elements are formed on a single crystalline silicon substrate containing a cavity therein, comprising: a first dielectric film covering the cavity; a plurality of n-type polycrystalline silicon layers formed on the first dielectric film, extending radially from the vicinity of a chip center; and metal film layers formed in contact with the n-type polycrystalline silicon layers, wherein hot junctions are formed at the chip central side and cold junctions are formed at the chip peripheral side of the n-type polycrystalline silicon layers, respectively, by contacting the n-type polycrystalline silicon layer and the metal film layer, and at least one series of thermoelectric elements is formed on the first dielectric film by connecting alternately and successively, by the metal film layer, said hot junction and cold junction of the neighboring n-type polycrystalline silicon layer.

A second aspect of the present invention is to provide a thermopile-type infrared sensor, in which thermoelectric elements are formed on a single crystalline silicon substrate containing a cavity therein, comprising: a first dielectric film covering the cavity; a plurality of n-type polycrystalline silicon layers formed on the first dielectric film, extending radially from the vicinity of a chip center; and metal film layers formed in contact with the n-type polycrystalline silicon layers, wherein hot junctions are formed at the chip central side and cold junctions are formed at the chip peripheral side of the n-type polycrystalline silicon layers, respectively, by contacting the n-type polycrystalline silicon layer and the metal film layer, and at least one series of thermoelectric elements is formed on the first dielectric film by connecting alternately and successively, by the metal film layer, said hot junction and cold junction of the neighboring n-type polycrystalline silicon layer, and an infrared absorption film is formed on a dielectric film that covers said series of thermoelectric elements.

According to the first and second aspects of the present invention, thermoelectric elements are radially formed from the vicinity of a chip center with distributing uniformly on the dielectric film so as to make the thermoelectric elements to be heat stress-resistant, and many thermoelectric elements are formed on the dielectric film followed by forming a series of thermoelectric elements in which the thermoelectric elements are connected in series, thereby improving an infrared detection efficiency of the sensor. Thus, since the thermoelectric elements are radially formed on the dielectric film, many thermoelectric elements can be formed on one surface, thereby improving the detection efficiency of the sensor. Further, the infrared absorption film is formed on the dielectric film that covers the series of thermoelectric elements, thereby further improving the detection efficiency of the sensor.

A third aspect of the present invention is to provide a thermopile-type infrared sensor, in which thermoelectric elements are formed on a single crystalline silicon substrate containing a cavity therein, comprising: a first dielectric film covering the cavity; a plurality of n-type polycrystalline silicon layers formed on the first dielectric film, said silicon layers firstly extending radially from a circumference in the vicinity of a chip center and secondly from a plurality of outer concentric circles toward a chip periphery respectively and said formed silicon layers being situated to form a complementary pattern with each other; a second dielectric film covering the n-type polycrystalline silicon layers and the first dielectric film; contact holes formed in the second dielectric film; and metal film layers formed in contact with the n-type polycrystalline silicon layers through the contact hole, wherein hot junctions are formed at the chip central side and cold junctions are formed at the chip peripheral side of the n-type polycrystalline silicon layers, respectively, by contacting the n-type polycrystalline silicon layer and the metal film layer through the contact hole, and at least one series of thermoelectric elements is formed on the first dielectric film by connecting alternately and successively, by the metal film layer, said hot junction and cold junction of the neighboring n-type polycrystalline silicon layer, and an infrared absorption film is formed on a dielectric film that covers said series of thermoelectric elements.

A fourth aspect of the present invention is to provide a thermopile-type infrared sensor, in which thermoelectric elements are formed on a single crystalline silicon substrate containing a cavity therein, comprising: a first dielectric film covering the cavity formed in the single crystalline silicon substrate; a plurality of n-type polycrystalline silicon layers formed on the first dielectric film, said silicon layers firstly extending radially from a circumference in the vicinity of a chip center and secondly from a plurality of outer concentric circles toward a chip periphery respectively and said formed silicon layers being situated to form a complementary pattern with each other; a second dielectric film formed on the n-type polycrystalline silicon layers and the first dielectric film; contact holes formed in the second dielectric film; metal film layers formed in contact with the n-type polycrystalline silicon layers through the contact holes; hot and cold junctions formed at the chip central side and the chip peripheral side of a plurality of the n-type polycrystalline silicon layers, respectively, by contacting the metal film layer and the n-type polycrystalline silicon layer through the contact hole; a series of thermoelectric elements formed by connecting alternately and successively said hot junction and cold junction by the metal film layer; a third dielectric film formed on the second dielectric film and the metal film layers; an infrared absorption film formed on the third dielectric film so as to cover the hot junctions; and electrode pads formed at ends of the series of thermoelectric elements.

According to the third and fourth aspects of the present invention, the n-type polycrystalline silicon layer containing many carriers, i.e. electrons having higher mobility than that of holes of p-type silicon is used as a thermoelectric material. Impurity concentration, temperature upon formation of the polycrystalline silicon and the crystallinity are controlled, thereby decreasing the lattice thermal conductivity and suitably controlling the Seebeck coefficient σ, and conductivity σ. The n-type polycrystalline silicon is used as the thermoelectric material, allowing high mobility of electrons to be used and low electrical resistance to be obtained under the same Seebeck coefficient, thereby improving the S/N ratio, i.e. ratio of output voltage to Johnson noise. Further, a pattern layout of the n-type polycrystalline silicon layer is placed over a whole membrane part as a striped pattern and the hot junctions are formed on the three concentric circles of the radial striped pattern, thereby relaxing and dispersing stresses in the membrane part due to the polycrystalline silicon layer, and decreasing cracks and bends that occur at the membrane part, and improving a yield upon an anisotropic etching.

A fifth aspect of the present invention is to provide a thermopile-type infrared sensor, in which thermoelectric elements are formed on a single crystalline silicon substrate containing a cavity therein, comprising: a first dielectric film covering the cavity; a plurality of n-type polycrystalline silicon layers formed on the first dielectric film, said silicon layers firstly extending radially from a circumference in the vicinity of a chip center and secondly from a plurality of outer concentric circles toward a chip periphery respectively and said formed silicon layers being situated to form a complementary pattern with each other; metal film layers formed in contact with the n-type polycrystalline silicon layers; hot and cold junctions formed at the chip central side and the chip peripheral side of the n-type polycrystalline silicon layers, respectively, by contacting the n-type polycrystalline silicon layer and the metal film layer; a series of thermoelectric elements formed on the first dielectric film, in which the metal film layer connected with the hot junction extends on the first dielectric film and connects with the cold junction on a neighboring n-type polycrystalline silicon layer, thereby connecting the hot junction and the cold junction alternately and successively; and an infrared absorption film formed on a second dielectric film that covers the series of thermoelectric elements.

According to the fifth aspect of the present invention, the metal film layer that makes connection between the hot and cold junctions is formed on the first dielectric film, allowing to save the formation of a second dielectric film and contact holes formed therein, thereby reducing the man-hour.

A sixth aspect of the present invention is to provide a thermopile-type infrared sensor, in which thermoelectric elements are formed on a single crystalline silicon substrate containing a cavity therein, comprising: a first dielectric film covering the cavity; a plurality of first n-type polycrystalline silicon layers formed on the first dielectric film, said silicon layers firstly extending radially from a circumference in the vicinity of a chip center and secondly from a plurality of outer concentric circles toward a chip periphery respectively and said formed silicon layers being situated to form a complementary pattern with each other; a second dielectric film covering the first n-type polycrystalline silicon layers and the first dielectric film; a plurality of second n-type polycrystalline silicon layers formed on the second dielectric film, having the same pattern as a pattern of the first n-type polycrystalline silicon layers but shifted by half of a pitch toward the circumference of a chip; a third dielectric film covering the second n-type polycrystalline silicon layers; contact holes formed on the second and third dielectric films covering the first and second n-type polycrystalline silicon layers, respectively; metal film layers formed in contact with the first and second n-type polycrystalline silicon layers through the contact hole; hot and cold junctions formed at the chip central side and the chip peripheral side, respectively, of the first and second n-type polycrystalline silicon layers by contacting the first and second n-type polycrystalline silicon layers and the metal film layer through the contact hole; a series of thermoelectric elements formed by connecting alternately and successively said hot junction and cold junction of the neighboring n-type polycrystalline silicon layer by the metal film layer; and an infrared absorption film formed on a dielectric film that covers the series of thermoelectric elements.

According to the sixth aspect of the present invention, a pattern layout is formed to have double layers of the n-type polycrystalline silicon, enlarging an area of the n-type polycrystalline silicon layer, thereby reducing the resistivity thereof and improving the S/N ratio.

Preferably, a crystallographic plane of the single crystalline silicon substrate is (100), thereby providing an advantage to a formation of the cavity in the substrate by an anisotropic etching.

Preferably, the n-type polycrystalline silicon layers radially placed from a chip center have combination of fan-shaped patterns extending toward a chip periphery, thereby reducing a resistivity of the n-type polycrystalline silicon layers between the hot and cold junctions due to a wide width of a pattern of the n-type polycrystalline silicon layers and improving the S/N ratio of the thermopile elements. Further, since the n-type polycrystalline silicon layers are formed on a whole surface of the membrane, a stress-resistant structure of the thermopile elements is obtained.

Preferably, the hot junctions are placed on concentric circles of radius $r_1$, $r_2$ and $r_3$ with respect to a chip center in a relation of $r_1<r_2<r_3$, thereby reducing the resistivity of the n-type polycrystalline silicon layers composing each thermoelectric element and providing an infrared sensor having high S/N ratio since a part on the membrane to be heated by the incident infrared ray is circularly distributed around the chip center so as to generate the output voltage effectively.

Preferably, the infrared absorption film formed on the series of thermoelectric elements consists of one member selected from the group consisting of borosilicate glass, polyimide resin, vinyl resin and acrylic resin, thereby a dielectric film made by glass, such as borosilicate glass, is annealed and melted to reduce pin-holes. The borosilicate glass extends a wavelength region in which infrared ray is absorbed. In case of using resin, since an absorbency of the infrared ray is increased and the wavelength region in which infrared ray is absorbed is extended, a sensitivity of the infrared sensor can be improved.

Preferably, the dielectric film covering the series of thermoelectric elements consists of two layers of phosphosilicate glass and SiN, thereby relaxing a stress of the membrane part.

Preferably, the first dielectric film consists of two layers of $SiO_2$ and SiN, or three layers consisting of a SiN layer sandwiched by $SiO_2$ layers, thereby relaxing a stress of the membrane part. In addition, these layers serve as an etch-stop layer upon a formation of the cavity.

Preferably, peripheral portions of the n-type polycrystalline silicon layers are formed in a step-shape except portions on which the hot and cold junctions are formed, thereby solving a problem of step coverage and reducing a thickness of the metal film layer to be in contact with the polycrystalline silicon. Thus, a stress in the metal film layer is reduced, allowing formation of a flat membrane to be easily done and improving the yield.

Preferably, cross sections of periphery of the n-type polycrystalline silicon layers are in a tapered-shape, thereby solving the problem of step coverage. Thus, a disconnection of the metal film layer that makes connection between the hot and cold junctions does not occur and a thickness of the metal film layer can be reduced, thereby allowing formation of a flat membrane to be easily performed and improving the yield.

Preferably, a resistivity of the n-type polycrystalline silicon layers is 1 to 10 mΩ·cm, thereby the trade-off relationship between the Seebeck coefficient and the electrical resistivity can be suitably controlled. That is, when the resistivity of the n-type polycrystalline silicon layers is less than 1 mΩ·cm, the Seebeck coefficient becomes small causing a practical output voltage not to be obtained, and when more than 10 mΩ·cm, the Seebeck coefficient becomes large but a temperature coefficient of the Seebeck coefficient and Johnson noise also become large, causing the S/N ratio to decrease. Therefore, the resistivity of the n-type polycrystalline silicon layers is preferably 1 to 10 mΩ·cm.

Preferably, the dielectric film covering the series of thermoelectric elements contains at least one member selected from the group consisting of $SiO_2$, SiN, SiNO, phosphosilicate glass, $Al_2O_3$ and SIALON.

The passivation film consisting of a combination among $SiO_2$, SiN, and SiNO is used, thereby relaxing a stress of the membrane part, improving an airtight property thereof and allowing a flat membrane to be formed. Further, at least one member selected from the group consisting of PSG, $Al_2O_3$ and SIALON is used followed by formation of the phosphosilicate glass, thereby relaxing a stress of the membrane part.

Preferably, the metal film layer consists of at least one member selected from the group consisting of Al, Cr, Ta, Mo, W and NiCr.

At least one member selected from the group consisting of Al, Cr, Ta, Mo, W, W-alloy and NiCr, which has low thermal conductivity and has good adherence with the $SiO_2$ dielectric layer, is used as a material of the metal film layer to be in contact with the n-type polycrystalline silicon layers, thereby minimizing a dissipation of heat from the heat-sensitive part, increasing a temperature rise in the heat-sensitive part and contributing to the mass production.

Preferably, a surface of the infrared absorption film has a striped pattern having unevenness, thereby increasing the absorbency of the infrared ray by reducing the reflection of the infrared ray.

Preferably, the thermopile-type infrared sensor is enclosed in a package, a window consisting of an infrared-transmissible filter is mounted at an opening formed on a cap of the package, a shape of the window is quadrilateral or hexagonal, the opening fits with the window, and notches formed at each corner of the opening are placed outside compared to intersection points among each side of the quadrilateral or hexagonal.

Preferably, the thermopile-type infrared sensor is enclosed in a package, a window consisting of an infrared-transmissible filter is mounted at an opening formed on a cap of the package, a shape of the window is quadrilateral or hexagonal, the opening fits with the window, and hollows formed at each corner of the opening position and mount the window.

The shape of the window fits with that of the opening formed on the cap of the package, thereby the window is fitted to the opening to be fixed therein. Curved notches are formed in the opening at which corners of the window are fitted to so as to minimize a gap as small as possible. There is provided a hollow at each corner of the opening, and the window is fitted into the opening, abutting each corner of the window on the bottom of the hollow followed by gluing, thereby firmly fixing the window with the cap.

A seventh aspect of the present invention is to provide a process for producing a thermopile-type infrared sensor comprising the steps of: forming a first dielectric film on both sides of a single crystalline silicon substrate by thermal oxidation, chemical vapor deposition or sputtering; depositing a polycrystalline silicon layer on the first dielectric film by chemical vapor deposition or sputtering; forming a n-type polycrystalline silicon layer having resistivity of 1 to 10 mΩ·cm by diffusing impurities into the polycrystalline silicon layer; patterning the n-type polycrystalline silicon layer so as to have a set of patterns consisting of patterns radially extending in striped shape from a fan-shaped pattern formed between radii $r_1$ and $r_2$ around a chip center up to the vicinity of a periphery of the substrate, patterns radially extending in striped shape toward outside from $r_2$ up to the vicinity of the periphery of the substrate, and patterns radially extending in striped shape toward outside from $r_3$ up to the vicinity of the periphery of the substrate; forming a second dielectric film on a plurality of the patterned n-type polycrystalline silicon layers and the first dielectric film by chemical vapor deposition, glass coating or sputtering; forming contact holes on the second dielectric film at which hot and cold junctions to be formed; depositing a metal film layer by sputtering or vacuum evaporation after forming the contact holes; patterning the metal film layer, then making ohmic contact between the n-type polycrystalline silicon layers and the metal film layers at the contact holes and then, forming a series of thermoelectric elements by connecting each thermoelectric element consisting of a pair of hot and cold junctions in series; forming a third dielectric film on the metal film layers and on the second dielectric film and forming an infrared absorption film at the chip center; and forming an opening in the first dielectric film formed on the back of the single crystalline silicon substrate, followed by forming a cavity in the back of the single crystalline silicon substrate by etching and then, followed by exposing the first dielectric film from the back of the single crystalline silicon substrate.

An eighth aspect of the present invention is to provide a process for producing a thermopile-type infrared sensor comprising the steps of: forming a first dielectric film on both sides of a single crystalline silicon substrate by thermal oxidation, chemical vapor deposition or sputtering; depositing a polycrystalline silicon layer on the first dielectric film by chemical vapor deposition or sputtering; forming a n-type polycrystalline silicon layer having resistivity of 1 to 10 mΩ·cm by diffusing impurities into the polycrystalline silicon layer; patterning the n-type polycrystalline silicon layer so as to have a set of patterns consisting of patterns radially extending in striped shape from a fan-shaped pattern formed between radii $r_1$ and $r_2$ around a chip center up to the vicinity of a periphery of the substrate, patterns radially extending in striped shape toward outside from $r_2$ up to the vicinity of the periphery of the substrate, and patterns radially extending in striped shape toward outside from $r_3$ up to the vicinity of the periphery of the substrate, and then, a part of thus patterned n-type polycrystalline silicon layers is etched so as to have mesa shape; patterning by using a pattern that is larger than the pattern of said mesa shape n-type polycrystalline silicon layers but similar in shape, followed by etching with the exception of the n-type polycrystalline silicon layers situated near the periphery of said mesa shape n-type polycrystalline silicon layers, thereby forming a tapered and step-like shaped n-type polycrystalline silicon layers; forming a second dielectric film on said step-like shaped n-type polycrystalline silicon layers, then forming contact holes on the second dielectric film at which hot and cold junctions to be formed; forming a metal film layer by sputtering or vacuum evaporation; patterning the metal film layer, then making ohmic contact between said step-like shaped n-type polycrystalline silicon layers and the metal film layers at the contact holes and then, forming a series of thermoelectric elements by connecting each thermoelectric element consisting of a pair of hot and cold junctions in series; forming a third dielectric film on the metal film layers and the second dielectric film, then forming an infrared absorption film on the third dielectric film; and forming a cavity in the back of the single crystalline silicon substrate, then exposing the first dielectric film from the back of the single crystalline silicon substrate.

A ninth aspect of the present invention is to provide a process for producing a thermopile-type infrared sensor comprising the steps of: forming a first dielectric film on both sides of a single crystalline silicon substrate by thermal oxidation, chemical vapor deposition or sputtering; depositing a first polycrystalline silicon layer on the first dielectric film by chemical vapor deposition or sputtering; patterning the first polycrystalline silicon layer so as to have a first pattern consisting of patterns radially extending in striped shape from a fan-shaped pattern formed between radii $r_1$ and $r_2$ around a chip center up to the vicinity of a periphery of the substrate, patterns radially extending in striped shape toward outside from $r_2$ up to the vicinity of the periphery of the substrate, and patterns radially extending in striped shape toward outside from $r_3$ up to the vicinity of the periphery of the substrate, then depositing a second polycrystalline silicon layer and then, forming a first n-type polycrystalline silicon layer having said first pattern and a second n-type polycrystalline silicon layer, both having resistivity of 1 to 10 mΩ·cm, by doping impurities; patterning the second n-type polycrystalline silicon layer by using a second pattern that is larger than said first pattern but similar in shape, thereby forming the periphery of n-type polycrystalline silicon layers formed by using said second pattern to be tapered and step-shaped; forming a second dielectric film on the n-type polycrystalline silicon layers formed by using said second pattern, then forming contact holes on the second dielectric film at which hot and cold junctions to be formed; forming a metal film layer by sputtering or vacuum evaporation; patterning the metal film layer, then making ohmic contact between the n-type polycrystalline silicon layers and the metal film layers at the contact holes and then, forming a series of thermoelectric elements by connecting each thermoelectric element consisting of a pair of hot and cold junctions in series; forming a third dielectric film on the metal film layers and the second dielectric film, then forming an infrared absorption film on the third dielectric film; and forming a cavity in the back of the single crystalline silicon substrate, then exposing the first dielectric film from the back of the single crystalline silicon substrate.

A tenth aspect of the present invention is to provide a process for producing a thermopile-type infrared sensor comprising the steps of: forming a first dielectric film on both sides of a single crystalline silicon substrate by thermal oxidation, chemical vapor deposition or sputtering; depositing a first polycrystalline silicon layer on the first dielectric film by chemical vapor deposition or sputtering; forming a first n-type polycrystalline silicon layer having resistivity of 1 to 10 mΩ·cm by diffusing impurities into the first polycrystalline silicon layer; patterning the first r-type polycrystalline silicon layer so as to have a first pattern consisting of patterns radially extending in striped shape from a fan-shaped pattern formed between radii $r_1$ and $r_2$ around a chip center up to the vicinity of a periphery of the substrate, patterns radially extending in striped shape toward outside from r, up to the vicinity of the periphery of the substrate, and patterns radially extending in striped shape toward outside from $r_3$ up to the vicinity of the periphery of the substrate; forming a second dielectric film on a plurality of the patterned first n-type polycrystalline silicon layers and on the first dielectric film by chemical vapor deposition, glass coating or sputtering; depositing a second polycrystalline silicon layer on the second dielectric film, then doping the second polycrystalline silicon layer with impurities, thereby forming a second n-type polycrystalline silicon layer having resistivity of 1 to 10 mΩ·cm; patterning the second n-type polycrystalline silicon layer so as to have a second pattern that is the same pattern in shape as the first pattern of the first n-type polycrystalline silicon layers but shifted by half of a pitch toward the circumference of a chip; forming a third dielectric film on the patterned first and second n-type polycrystalline silicon layers, then forming contact holes on the second or third dielectric film at which hot and cold junctions are to be formed; forming a metal film layer on the third dielectric film; patterning the metal film layer, then making ohmic contact between the first and second n-type polycrystalline silicon layers and the metal film layers at the contact holes and then, forming a series of thermoelectric elements by connecting each thermoelectric element consisting of a pair of hot and cold junctions in series; forming a fourth dielectric film on the metal film layers and the third dielectric film, then forming an infrared absorption film on the fourth dielectric film; and forming a cavity in the back of the single crystalline silicon substrate, then exposing the first dielectric film from the back of the single crystalline silicon substrate.

An eleventh aspect of the present invention is to provide a process for producing a thermopile-type infrared sensor comprising the steps of: forming a first dielectric film on both sides of a single crystalline silicon substrate by thermal oxidation, chemical vapor deposition or sputtering; depositing a polycrystalline silicon layer on the first dielectric film by chemical vapor deposition or sputtering; forming a n-type polycrystalline silicon layer having resistivity of 1 to 10 mΩ·cm by diffusing impurities into the polycrystalline silicon layer; patterning the n-type polycrystalline silicon layer so as to have a set of patterns consisting of patterns radially extending in striped shape from a fan-shaped pattern formed between radii $r_1$ and $r_2$ around a chip center up to the vicinity of a periphery of the substrate, patterns radially extending in striped shape toward outside from $r_2$ up to the vicinity of the periphery of the substrate, and patterns radially extending in striped shape toward outside from $r_3$ up to the vicinity of the periphery of the substrate; forming a metal film layer on the first dielectric film and the patterned n-type polycrystalline silicon layers; patterning the metal film layer, then making ohmic contact between the n-type polycrystalline silicon layers and the metal film layers so as to form hot and cold junctions and then, forming a series of thermoelectric elements by connecting each thermoelectric element consisting of a pair of hot and cold junctions in series through the metal film layer; forming a second dielectric film on the first dielectric film, the metal film layers and the patterned n-type polycrystalline silicon layers, then forming an infrared absorption film on the second dielectric film at a chip center; and forming a cavity in the back of the single crystalline silicon substrate by etching, then exposing the first dielectric film from the back of the single crystalline silicon substrate.

Preferably, the infrared absorption film formed on the series of thermoelectric elements consists of one member selected from the group consisting of borosilicate glass, polyimide resin, vinyl resin and acrylic resin.

Preferably, the process further comprises a step of baking the infrared absorption film so as to make a surface thereof have an uneven striped pattern, thereby improving the absorbency of infrared ray.

Preferably, a thickness of the infrared absorption film is 1 to 15 μm and an unevenness of 1 to 10 μm is formed on a surface of the infrared absorption film.

If the thickness of the infrared absorption film is more than 15 μm, the absorption efficiency deteriorates. If the size of unevenness is more than 10 μm, the absorption efficiency deteriorates.

In the aforementioned process for producing a thermopile-type infrared sensor, a temperature of 600 to 700° C. is used upon formation of the polycrystalline silicon layer by low-pressure CVD, thereby promoting crystallization of silicon to form the polycrystal, raising the carrier mobility, decreasing the resistivity of the polycrystalline silicon film, increasing the Seebeck coefficient, and improving the S/N ratio.

The hot junctions of the thermoelectric element are placed on the concentric circles, thereby reducing the resistivity of the n-type polycrystalline silicon layers composing each thermoelectric element and providing an infrared sensor having high S/N ratio since a part on the membrane to be heated by the incident infrared ray is circularly distributed around the chip center so as to generate the output voltage effectively. The layout of the n-type polycrystalline silicon layers is formed in such a manner that the hot junctions are placed on the concentric circles having radius $r_1$, $r_2$ and $r_3$ with respect to a chip center in a relation of $r_1<r_2<r_3$, thereby preventing concentration of stress from occurring in the membrane due to the formation of the n-type polycrystalline silicon.

The thermopile-type infrared sensor according to the present invention is used in such a manner that the thermopile element (chip) is mounted on a substrate, or is packaged in a package. In the present invention, a metallic case or a ceramic package made of a material such as $Al_2O_3$ and AlN is employed as the package, thereby enabling the chip to follow a change of atmospheric temperature, preventing a temperature distribution in the package from occurring, and enabling an accurate temperature compensation at the cold junction to be carried out.

BRIEF DESCRIPTION OF THE DRAWINGS

The file of this patent contains at least one drawing executed in color. Copies of this patent or patent application publication with color drawing(s) will be provided by the Patent and Trademark Office upon request and payment of the necessary fee.

FIGS. 13A, 13B and 13C are sectional views taken along A—A, B—B and C—C lines in FIG. 12, respectively;

FIGS. 14A and 14B are sectional views taken along D—D and E—E lines in FIG. 12, respectively;

DESCRIPTION OF THE PREFERRED EMBODIMENTS

In the following, the preferred embodiments of thermopile-type infrared sensor and process for producing the same according to the present invention are explained with reference to the preferred embodiments No. 1 to 4 as well as the attached drawings.

Preferred Embodiment No. 1

Figure 1:
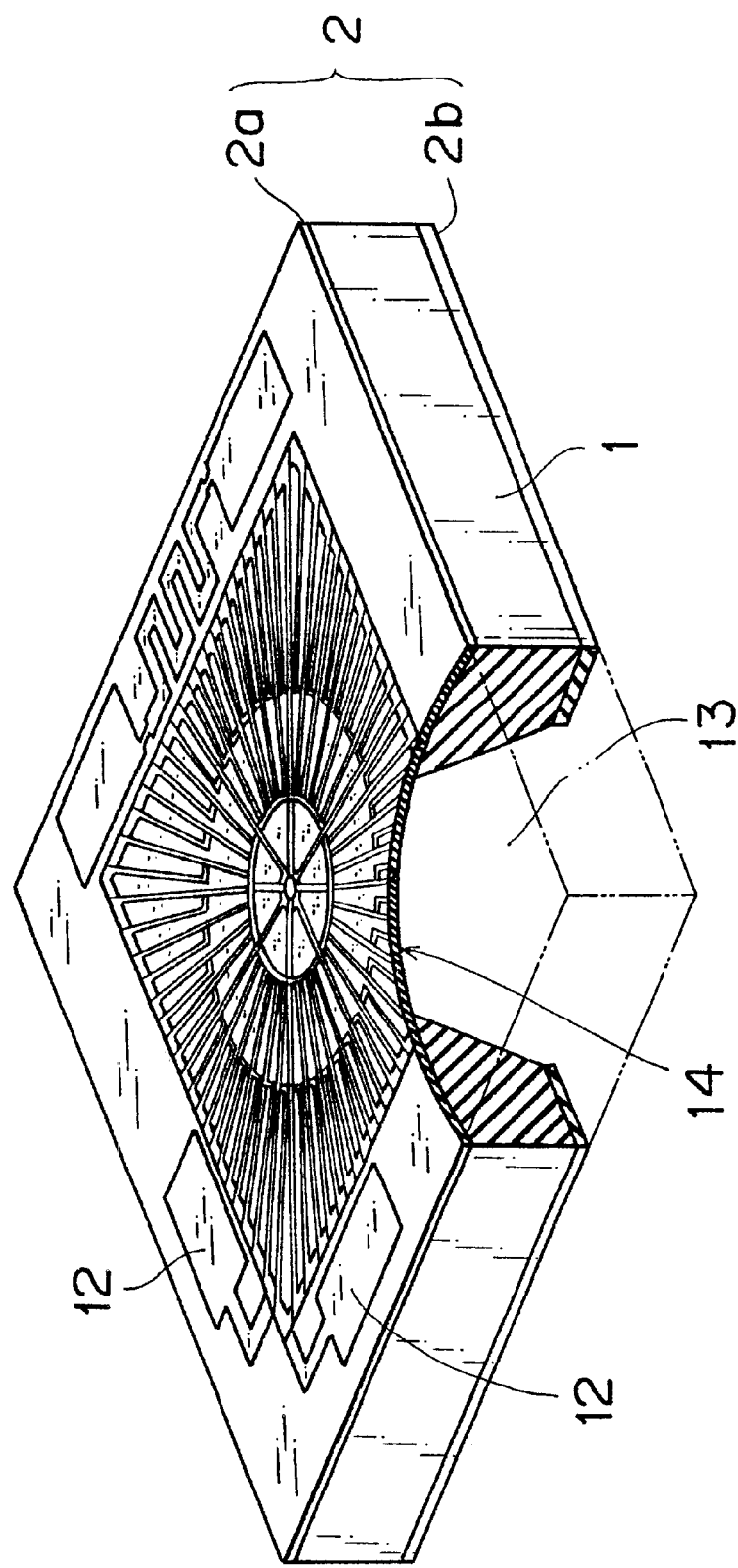
FIG. 1 is a partly broken perspective view illustrating preferred embodiment No. 1 of thermopile-type infrared sensor according to the present invention.
Figure 2:
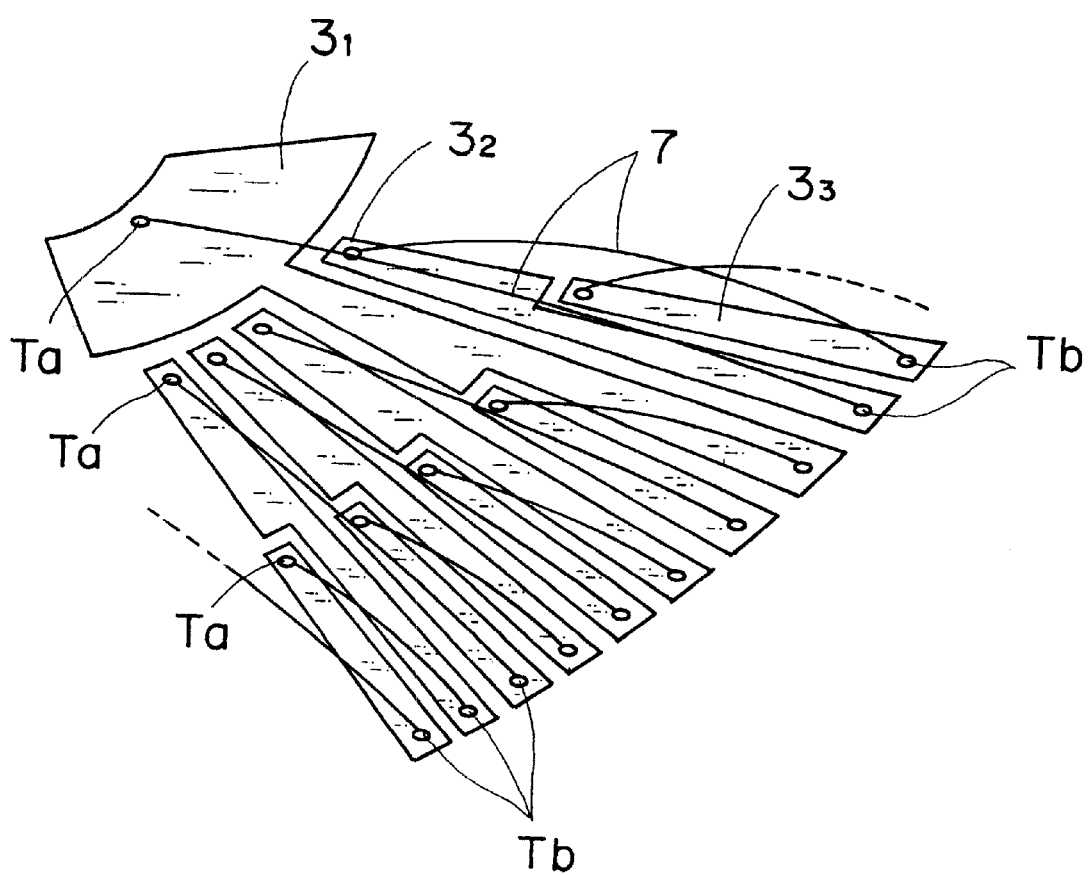
FIG. 2 is a schematic representation illustrating a thermopile-type infrared sensor according to the present invention.
Figure 3A:
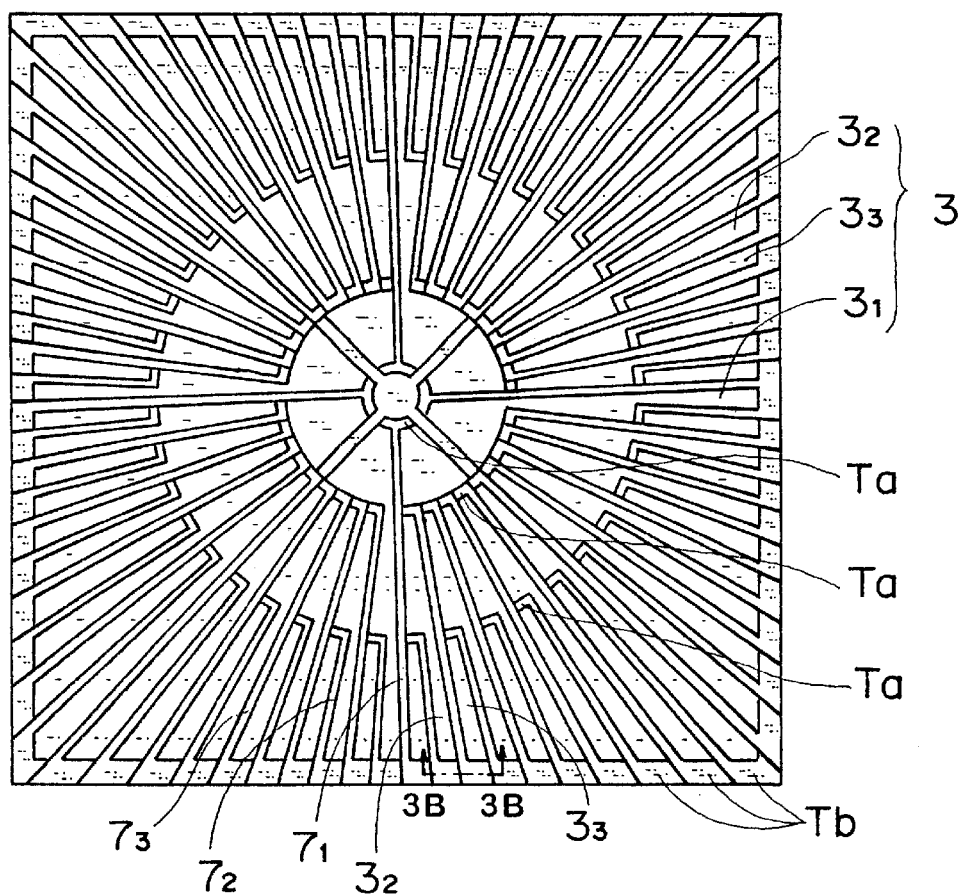
FIG. 3A is a plan view of the thermopile-type infrared sensor shown in FIG. 1.
Figure 3B:
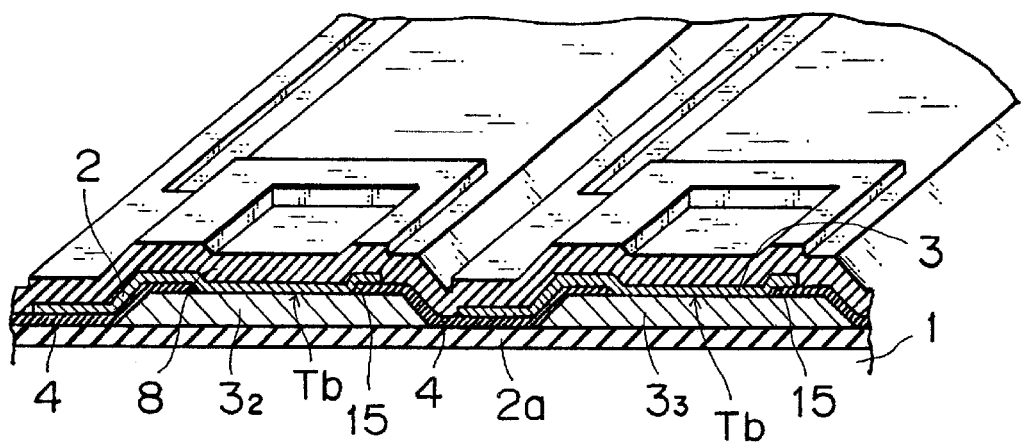
FIG. 3B is a sectional view taken along X—X line in FIG. 3A.
Figure 4:
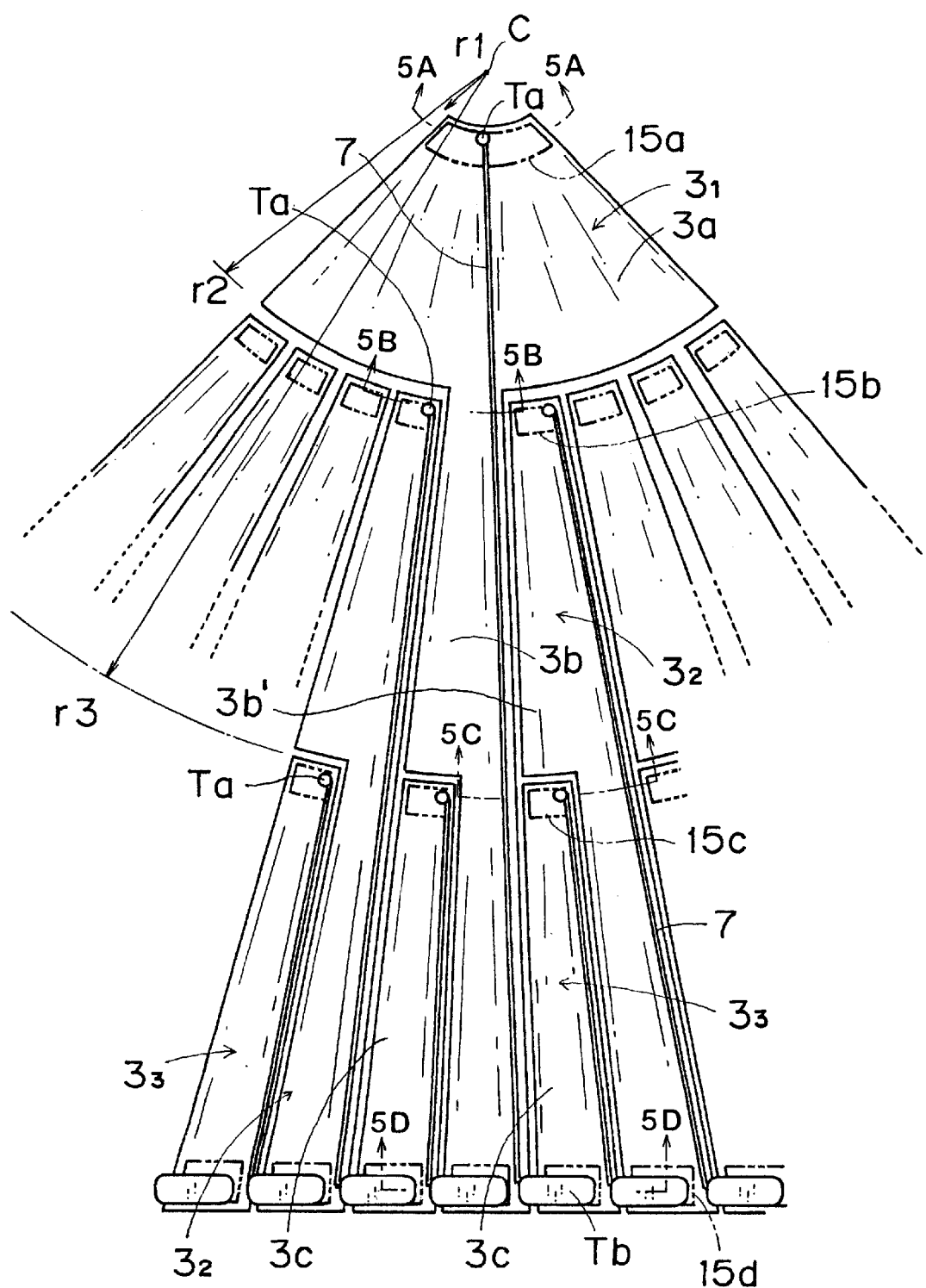
FIG. 4 is a partly enlarged plan view of the thermopile-type infrared sensor shown in FIG. 1.
Figure 5A:
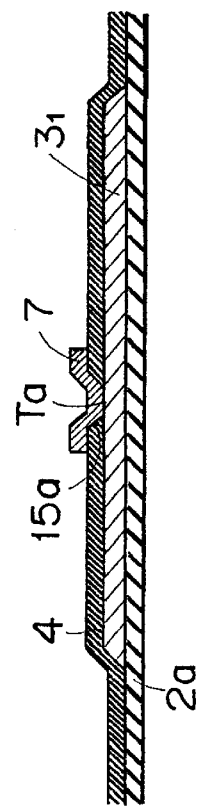
FIGS. 5A, 5B, 5C and 5D are sectional views taken along A—A, BB, C—C and D—D lines in FIG. 4, respectively.
Figure 5B:
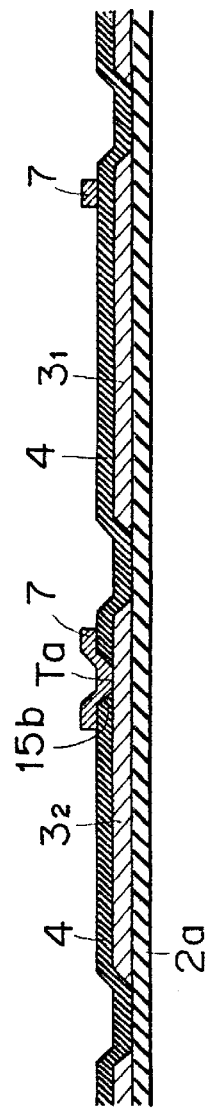
Figure 5C:
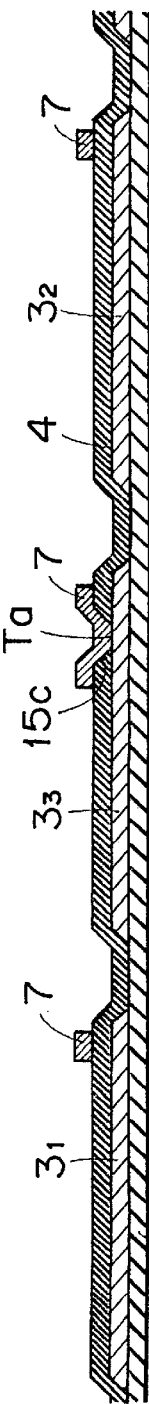
Figure 5D:
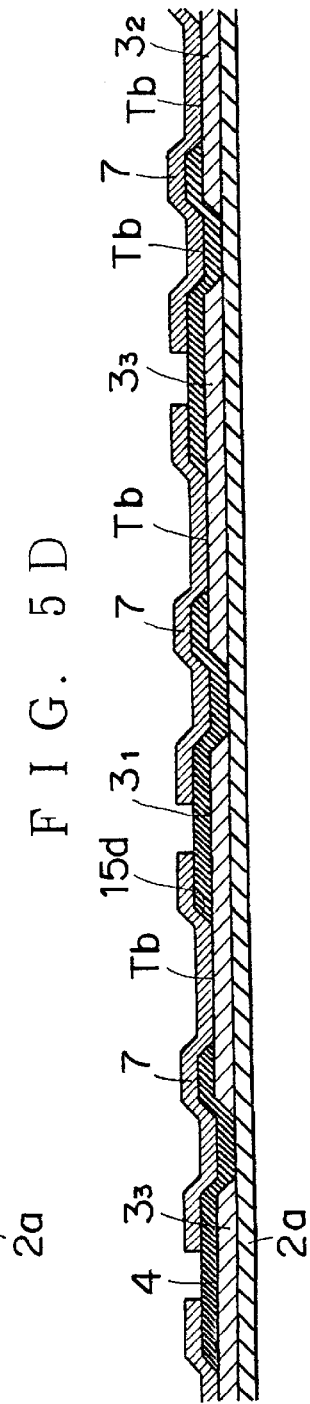
Figure 6A:
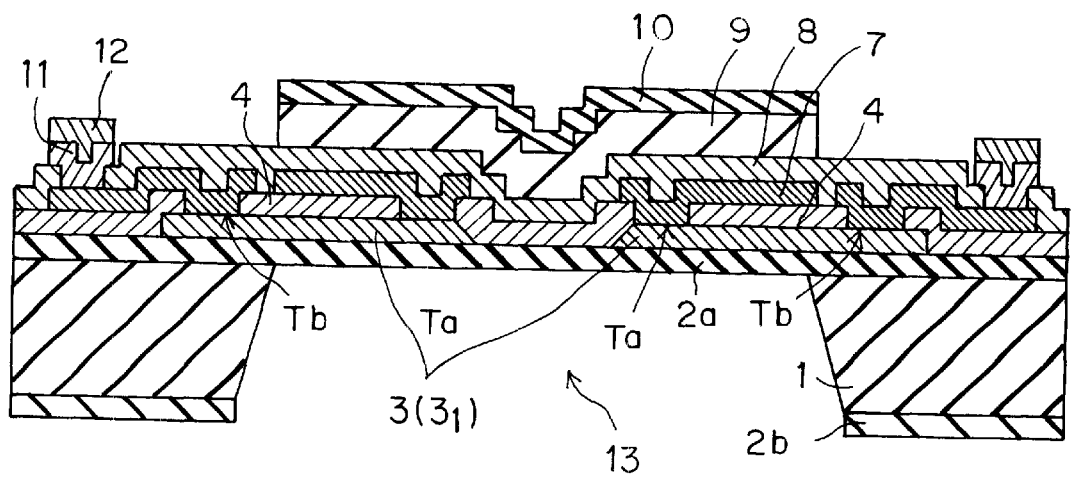
FIG. 6A is a schematic sectional view illustrating one embodiment of a thermopile-type infrared sensor according to the present invention.
Figure 6B:
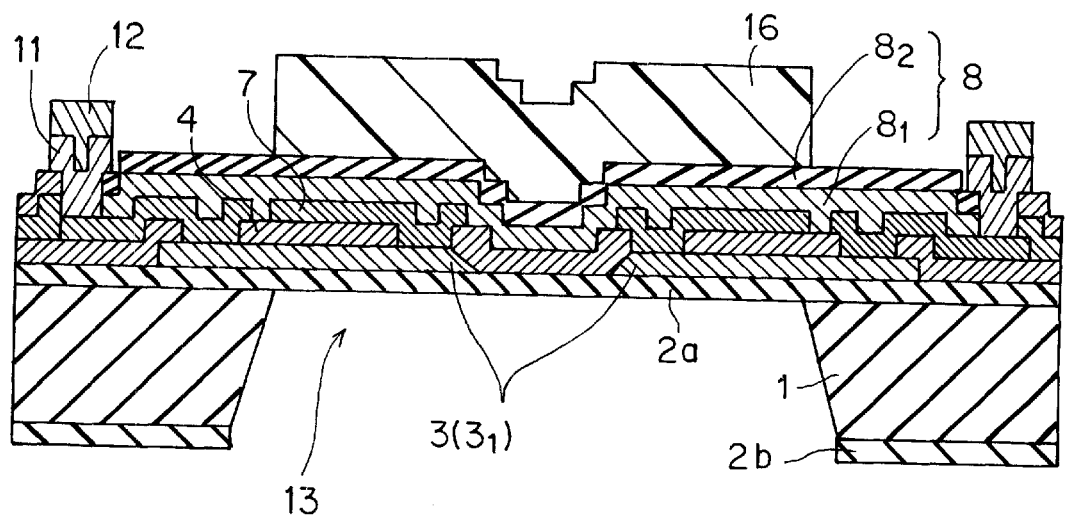
FIG. 6B is a schematic sectional view illustrating another embodiment of a thermopile-type infrared sensor according to the present invention.

The preferred embodiment No. 1 is explained with reference to FIGS. 1 to 6. FIG. 1 is a partly broken perspective view illustrating a thermopile element (chip) of a thermopile-type infrared sensor according to the preferred embodiment No. 1; FIG. 2 is a schematic representation illustrating connections between each thermoelectric element of a thermopile-type infrared sensor; FIG. 3A is a plan view of the polycrystalline silicon layer shown in FIG. 1, in which a dielectric film, a passivation film, a resin absorption film and the like are not shown; FIG. 3B is a sectional view taken along X—X line in FIG. 3A, in which a dielectric film is formed; FIG. 4 is a partly enlarged plan view illustrating an outline of the thermopile-type infrared sensor according to the preferred embodiment No. 1; FIGS. 5A, 5B, 5C and 5D are sectional views taken along A—A, B—B, C—C and D—D lines in FIG. 4, respectively, in which each dielectric film is formed; FIGS. 6A and 6B are schematic sectional views each illustrating an embodiment of a thermopile-type infrared sensor, in which a passivation film and an infrared absorption film are formed in the thermopile element.

As shown in FIG. 1, a cavity 13 is formed in a single crystalline silicon substrate 1 and a dielectric film 2a is formed in such a manner that the dielectric film 2a covers the cavity 13, thereby forming a membrane 14. Radial n-type polycrystalline silicon layers are formed on the dielectric film 2a that covers the cavity 13, and hot and cold junctions are formed at which the n-type polycrystalline silicon layers are in contact with film layers of metal such as aluminum. The hot junction and cold junction of the neighboring n-type polycrystalline silicon layer are alternately and successively connected by the metal film layer to form a series of thermoelectric elements on the dielectric film 2a. The hot junctions are formed on the dielectric film 2a on the cavity 13 and the cold junctions are formed on the dielectric film 2b on the single crystalline silicon substrate 1. Leads from the series of thermoelectric elements are connected to electrode pads 12 formed at the outside of the polycrystalline silicon layer. Thus, the dielectric film 2a is formed in such a manner that the dielectric film 2a covers the cavity 13 formed in the single crystalline silicon substrate 1, and a heat-sensitive part consisting of the series of thermoelectric elements is formed on the dielectric film 2a. Further, as explained later on, a passivation film and an infrared absorption film are formed in such a manner that they cover the heat-sensitive part.

In the following, connections between each thermoelectric element are explained with reference to FIG. 2. As shown in FIG. 2, n-type polycrystalline silicon layers $3_1$, $3_2$ and $3_3$ are formed in an island-shape. A hot junction Ta of $3_1$ is connected to a cold junction Tb of $3_2$ by the metal film layer 7, in addition, the hot junction Ta of $3_2$ is connected to the cold junction Tb of $3_3$ by the metal film layer 7. Thus, the hot junction Ta of a n-type polycrystalline silicon layer is connected to the cold junction Tb of an adjacent n-type polycrystalline silicon layer by the metal film layer 7, thereby the thermoelectric elements are connected in series by the metal film layers 7 to form the series of thermoelectric elements, terminals of which are connected to the electrode pads 12.

As shown in FIG. 3, regarding a pattern of the thermopile-type infrared sensor according to the preferred embodiment No. 1, n-type polycrystalline silicon layers $3_1$, $3_2$ and $3_3$, and metal film layers $7_1$, $7_2$ and $7_3$, which work as electrical wiring, are formed radially, thereby forming a series of thermoelectric elements. For example, four hot junctions Ta are formed on a circumference in the vicinity of the chip center, 36 hot junctions on a circumference of the outside concentric circle and 40 hot junctions on a circumference of the further outside concentric circle. Eighty cold junctions Tb of these thermoelectric elements are formed, which is the same number with the number of the hot junctions, at the periphery of the chip on the dielectric film formed on the single crystalline silicon substrate 1. Thus, the thermoelectric elements are radially formed with respect to the chip center.

The pattern of the thermopile-type infrared sensor consists of a combination of patterns of island-like n-type polycrystalline silicon layers $3_1$, $3_2$ and $3_3$, in which the n-type polycrystalline silicon layer $3_1$ consists of a fan-shaped pattern, a pivot of which is the chip center, and a pattern of a striped shape part that extends from the fan-shaped pattern to the periphery of the chip. The striped shape part is a hook-shaped n-type polycrystalline silicon layer, the width of which near the chip periphery is large except the portion complementing the other pattern. A hook-shaped n-type polycrystalline silicon layer $3_2$ is placed to complement the n-type polycrystalline silicon layer $3_1$ at a notched position thereof, while a striped shape n-type polycrystalline silicon layer $3_3$ is placed for complementing the n-type polycrystalline silicon layers $3_1$ and $3_2$ at notched positions thereof. A width of a pattern of the n-type polycrystalline silicon layer $3_3$ becomes larger as approaching the chip periphery. The hot junctions Ta are formed at an end of the central side of the chip containing these n-type polycrystalline silicon layers $3_1$, $3_2$ and $3_3$, while the cold junctions Tb are formed at the other end side. Thus, these island-like patterns of n-type polycrystalline silicon layers are radially situated uniformly on the dielectric film $2a$, thereby a stress distribution of the membrane structure can be uniform.

FIG. 3B is a sectional view taken along X—X line in FIG. 3A, in which a sectional view of the cold junction Tb is shown. The n-type polycrystalline silicon layers $3_2$ and $3_3$ formed on the dielectric film $2a$ are covered by a dielectric film 4, in which contact holes 15 are formed in the dielectric film 4. At each contact hole 15, a contact point, at which the n-type polycrystalline silicon layer $3_2$ or $3_3$ makes an ohmic contact with the metal film layer such as an aluminum film layer, is formed, thereby the cold junction Tb is formed at said contact point. The hot junction Ta is formed in a similar manner, in which the contact hole is formed in the dielectric film 4 and then, the n-type polycrystalline silicon layer makes an ohmic contact with the metal film layer 7. A periphery of the n-type polycrystalline silicon layer is tapered to prevent a steep difference in level from being formed.

FIG. 4 is a partly enlarged plan view of the thermopile-type infrared sensor, in which a quarter of the pattern is illustrated, the dielectric film is not shown, and the contact holes $15a$, $15b$ and $15c$ are shown by an alternate long and two short dashes line. FIGS. 5A, 5B, 5C and 5D are sectional views taken along A—A, B—B, C—C and D—D lines in FIG. 4, respectively, in which a dielectric film is shown. FIGS. 6A and 6B are schematic sectional views illustrating a film construction of the thermoelectric element in the thermopile-type infrared sensor according to the preferred embodiment No. 1.

As shown in FIGS. 4 and 5, the hot junctions Ta of the n-type polycrystalline silicon $3_1$, $3_2$ and $3_3$ are formed on circumferences of radius $r_1$, $r_2$ and $r_3$ ($r_1 < r_2 < r_3$), respectively, with respect to the chip center C, while the cold junctions Tb are formed at the end of the n-type polycrystalline silicon layers $3_1$, $3_2$ and $3_3$. The pattern of the n-type polycrystalline silicon layers $3_1$ consists of a fan-shaped pattern $3a$ formed between the radii $r_1$ and $r_2$ and a hook-shaped striped pattern $3b$ extended from the fan-shaped pattern $3a$ up to the vicinity of the periphery of the substrate 1, in which the hook-shaped striped pattern $3b$ consists of one fan-shaped piece formed between the radii $r_2$ and $r_3$ and another fan-shaped piece formed between the radius $r_3$ and the periphery of the substrate 1. The n-type polycrystalline silicon layer $3_2$ is formed in such a manner that $3_2$ compensates for the notched portion of the n-type polycrystalline silicon layers 31 in which the pattern of the n-type polycrystalline silicon layer $3_2$ is a striped pattern consisting of a hook-shaped pattern $3b'$ extended from the radius $r_2$ toward outside up to the vicinity of the periphery of the substrate 1. The n-type polycrystalline silicon layer $3_3$ is placed in such a manner that $3_3$ compensates for the notched portion of the hook-shaped patterns $3b$ and $3b'$, in which the pattern of the n-type polycrystalline silicon layer $3_3$ consists of a striped pattern $3c$ extended from the radius $r_3$ toward outside up to the vicinity of the periphery of the substrate 1.

The n-type polycrystalline silicon layers $3_1$, $3_2$ and $3_3$ are covered by the dielectric film 4. As shown in FIG. 5A, the contact hole $15a$ is formed on the dielectric film 4 at an end of the fan-shaped pattern $3a$ of the n-type polycrystalline silicon layer $3_1$. As shown in FIGS. 5B and 5C, the contact holes $15b$ and $15c$ are formed on the dielectric films at an end of the n-type polycrystalline silicon layers $3_2$ and $3_3$, respectively. The metal film layer 7 makes an ohmic contact with these contact holes $15a$, $15b$ and $15c$, thereby the hot junctions Ta are formed. As shown in FIG. 5D, a contact hole $15d$ is formed on the dielectric film 4 at the other ends of the n-type polycrystalline silicon layers $3_1$, $3_2$ and $3_3$. The metal film layer 7 makes an ohmic contact with the n-type polycrystalline silicon layer exposed from the contact hole $15d$, thereby the cold junctions Tb are formed. Thus, the hot junctions Ta are formed at the chip central sides, while the cold junctions Tb are formed at the other end.

As mentioned above, the thermopile-type infrared sensor according to the preferred embodiment No. 1 has one layer of n-type polycrystalline silicon, in which many n-type polycrystalline silicon layers 3 are formed radially in a striped shape on the dielectric film $2a$ formed on the surface of the single crystalline silicon substrate 1. Then, the contact holes $15a$, $15b$, $15c$ and $15d$ are formed on the dielectric film 4 that is formed on the dielectric film $2a$ and the n-type polycrystalline silicon layers 3 and then, the metal film layer 7 such as aluminum film layer is formed on the dielectric film 4 and then, the metal film layer 7 that connects the hot junction with the cold junction alternately and successively is formed by a patterning.

As shown in FIG. 6A, a dielectric film 8 made of SiN is formed on the series of thermoelectric elements, in which each thermoelectric element according to the preferred embodiment No. 1 is connected in series, and a borosilicate glass layer 9, on which a dielectric film 10 made of $SiO_2$ is coated, is formed in such a manner that the borosilicate glass layer 9 covers the hot junction Ta at the center of the heat-sensitive part. As shown in FIG. 6B, the dielectric film 8 consisting of phosphosilicate glass (hereinafter, PSG) layer $8_1$ and SiN $8_2$ is formed in such a manner that the dielectric film 8 covers the hot junction Ta at the center of the heat-sensitive part, in addition, an infrared absorption film 16 made of resin is formed in such a manner that the infrared absorption film 16 covers a central part of the membrane (the heat-sensitive part) in order to raise the infrared absorption. Thus, the glass layer or the resin absorption film is formed, thereby improving the infrared absorption characteristic as a sensor. The dielectric film 8 contains at least one element selected from the group consisting of $SiO_2$, PSG, $Al_2O_3$ and SIALON, besides SiN.

The dielectric film 10 shown in FIG. 6A is formed to protect the borosilicate glass layer 9 from an etching process. The borosilicate glass layer 9 and the dielectric film 10, which have a function as an infrared absorption film, are removed by an etching except their portions around the membrane center. As a material for the infrared absorption film 16 shown in FIG. 6B, an polyimide resin, vinyl resin, phenolic resin, epoxy resin, acrylic resin and synthetic rubber are used. A dielectric film $2b$, which is formed on the back of the substrate 1, is etched to make an opening therein, then the substrate 1 is etched by an anisotropic etching using an etching agent solution such as an alkaline etchant, thereby the cavity 13 is formed. A part of the dielectric film 8 is etched to make a hole therein, then an electrode pads 11 and 12 made of metal film and the like are formed thereon by sputtering. As a material for the electrode pads 11 and 12, at least one element selected from a group consisting of Au, Al, Cr, Ta, Mo, W and NiCr is used.

In the following, a preferred embodiment of a process for producing the thermopile-type infrared sensor according to the preferred embodiment No. 1 is explained with reference to FIGS. 1 to 6.

(1) The substrate 1 is a semiconductive single crystalline silicon substrate having crystallographic plane of (100) and thickness of about 400 μm and is thermally oxidized at around 900 to 1100° C., thereby the dielectric films $2a$ and 2b consisting of $SiO_2$ and having thickness of 0.1 to 1 μm are formed on the both sides of the substrate 1. The dielectric film 2a may be one layer of $SiO_2$, two layers consisting of $SiO_2$ layer+SiN layer, or three layers consisting of $SiO_2$ layer+SiN layer+$SiO_2$ layer.

(2) A non-doped polycrystalline silicon layer having 0.1 to 2 μm thickness is formed on the dielectric film 2a by LP-CVD or sputtering methods and then, phosphorus is doped into the non-doped polycrystalline silicon layer at 800 to 1150° C. by using $POCl_3$ as an impurity source. After the doping, PSG formed on the surface is etched by using buffer hydrofluoric acid. Thus treated polycrystalline silicon layer is a n-type polycrystalline silicon layer having resistivity of 1 to 10 mΩ·cm.

(3) A photo resist having thickness of 1 to 4 μm is formed on the n-type polycrystalline silicon layer 3. By using the photo resist as a mask, striped patterns of the n-type polycrystalline silicon layers are formed radially from the chip center as shown in FIG. 4. The striped patterns consist of the fan-shaped patterns 3a formed between the radii $r_1$ and $r_2$ and the hook-shaped striped patterns 3b extended from the fan-shaped pattern 3a up to the vicinity of the periphery of the substrate 1. Further, the hook-shaped patterns 3b' extended from the radius $r_2$ toward outside up to the vicinity of the periphery of the substrate 1 and the striped patterns 3c extended from the radius $r_3$ toward outside up to the vicinity of the periphery of the substrate 1 are formed.

Each pattern of the n-type polycrystalline silicon is formed by reactive ion etching (hereinafter, RIE) and the like, in which the n-type polycrystalline silicon layers $3_1$, $3_2$ and $3_3$ are island-like and placed in such a manner as complementing with each other. As a gas for etching the n-type polycrystalline silicon layer by RIE is preferably, for example, $SF_6$, in which an edge shape of the etched n-type polycrystalline silicon layers $3_1$, $3_2$ and $3_3$ becomes tapered-shape by employing an appropriate etching condition, thereby solving a problem of step coverage (such as disconnection of wiring,) for an upper layer film formed on the silicon layer. The n-type polycrystalline silicon layers may be subjected to an isotropic etching so as to make the periphery portion of the n-type polycrystalline silicon layers be a tapered shape or step-shape.

(4) Al—Si is deposited so that a thickness thereof becomes 0.2 to 1 μm by sputtering and then, the metal film layer 7 is formed by sputtering using phosphoric acid as an etchant. During this step, a number of the hot junctions and cold junctions are formed, thereby forming the heat-sensitive part consisting of the series of thermoelectric elements, in which the thermoelectric elements are connected in series.

(5) The dielectric film 8 made of SiN having thickness of 0.2 to 2 μm is formed on the heat-sensitive part by plasma CVD or sputtering and then, the borosilicate glass layer 9 having thickness of 0.3 to 3 μm is formed on the dielectric film 8. The borosilicate glass layer 9 is annealed at 300 to 600° C. followed by reflowing, thereby solving problems such as pin-hole formation and step coverage. Further, the dielectric film 10 made of $SiO_2$ having thickness of 0.1 to 2 μm is formed on the borosilicate glass layer 9 by sputtering. A material for the dielectric film 8 employed is a combination of members selected from the group consisting of $SiO_2$, SiN and SiNO: for example, two layers consisted of $SiO_2$ layer and SiN layer, or three layers consisted of a SiN layer sandwiched by $SiO_2$ layers.

(6) The borosilicate glass layer 9 and the dielectric film 10 made by $SiO_2$ on the membrane part 14 are partly removed by etching so as to form the infrared absorption film on the central part of the membrane.

(7) The dielectric film 8 is partly etched to make an opening therein followed by patterning of metal film layers 11 and 12, thereby the electrode pads are formed in such a manner to be overlapped with the dielectric film 8.

(8) In the final step, the dielectric film 2b on the back of the substrate 1 is etched to make an opening therein followed by an anisotropic etching from the back of the substrate 1 using an etching agent solution such as an alkaline etchant, thereby the cavity 13 is formed in the substrate 1.

As for the above etching of the substrate 1, the single crystalline silicon having crystallographic plane of (100) is subjected to anisotropic etching by using KOH to form a taper of 54.7° as shown in FIG. 1. This process has an advantage of producing inexpensive elements due to massive treatment by batch processing. However, this process causes a formation of a taper due to the crystal structure of silicon, causing difficulty in chip size miniaturization due to a formation of a useless part in the chip.

As a response to the demand of chip size miniaturization, a process of etching in which a silicon substrate is vertically etched by dry etching is employed, through which the single crystalline silicon can be etched vertically with an angle of 87° to 90° by dry etching using a RIE apparatus. The silicon substrate can also be vertically etched by employing an ICP-RIE apparatus, in which a highly dense plasma can be generated, by using $SiO_2$ or a resist as a mask for etching. By employing these processes, the chip size can be miniaturized.

A process for forming the infrared absorption film made of resin is explained with reference to FIG. 6B. The infrared absorption film 16 is formed in such a manner as covering a center part of the membrane and is consisting of at least one member selected from the group consisting of polyimide resin, vinyl resin and acrylic resin, in which a pigment such as carbon that improves an infrared absorption characteristic is added.

As a process for forming the infrared absorption film, a photolithography using spin coating or a printing method is employed. In the process for forming the infrared absorption film by photolithography, for example, a photosensitive resist is drip-feeded on a silicon wafer that is rotating on a spin coater in order to control a thickness of resist coated thereon to be 0.1 to 30 μm.

Thus coated film is prebaked at about 80 to 120° C. by a heating means such as a constant temperature oven and a hot plate. The prebaked film is subjected to an alignment of a desired pattern by a mask aligner, followed by exposing to light so as to remove a part of a resist, which corresponds to be a part of the infrared absorption film. Then, a developing and rinsing are carried out, and a postbake is done to make a final configuration.

Figure 19:
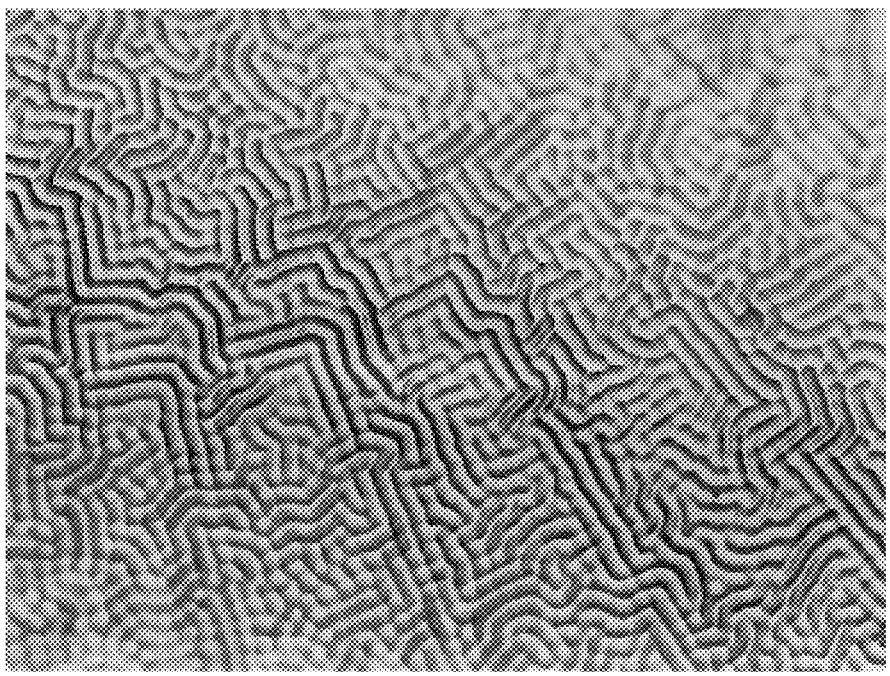
FIG. 19 is a digital photograph illustrating striped shape unevenness formed on a surface of an infrared absorption film.

Then, a resin solution containing carbon particles to be an infrared absorption film is spin-coated thereon with a film thickness of 1 to 30 μm. After prebaking at about 80 to 120° C., the resist is dissolved and lifted off by using a remover. Then, the postbake is done to finally form the infrared absorption film. In this postbake, temperature, time and heating process are controlled so as to form a striped pattern having unevenness of 1 to 10 μm on a surface of the infrared absorption film. FIG. 19 is a digital photograph illustrating a striped shape unevenness thus formed on the surface of the infrared absorption film. This infrared absorption film was postbaked at about 150 to 300° C. for 2 to 15 minutes on a hot plate.

As a resin for forming the infrared absorption film, a photosensitive resin may be used besides the resins described above. In this case, a step of lift-off can be saved.

A patterning by photolithography causes a very flat film having unevenness of 1 μm or less to form on the surface after spin-coating. This flat film has many advantages such as increment in resolution upon exposure, however optically, an incident infrared ray is reflected on the flat surface. A transmittance of infrared ray of a flat film formed by a conventional process is about 5% at wavelength of 10 μm, but a reflectivity is as high as 25%, causing an absorptance to substantially decrease.

In this regard, according to the preferred embodiments of the present invention, the striped shape pattern having unevenness of 1 to 10 μm is formed on the surface of the infrared absorption film so as to scatter the incident infrared ray at the unevenness formed on the surface of the infrared absorption film, resulting in that the reflectivity of the infrared ray is decreased by about 10%. Then, the absorptance of the infrared ray improves, thereby increasing an output power of the infrared sensor by about 5%.

Preferred Embodiment No. 2

Figure 7:
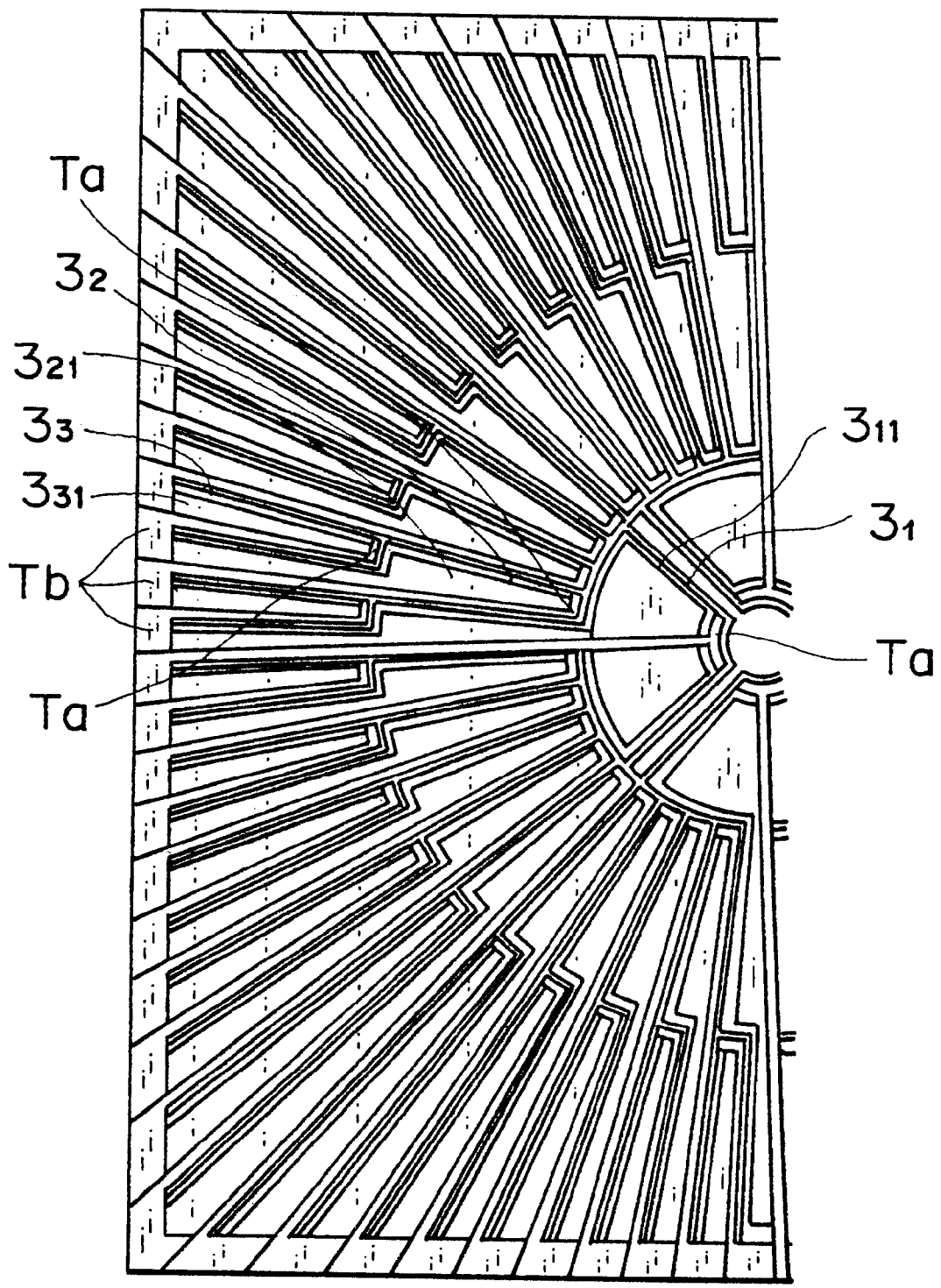
FIG. 7 is a partial plan view illustrating preferred embodiment No. 2 of thermopile-type infrared sensor according to the present invention.
Figure 8:
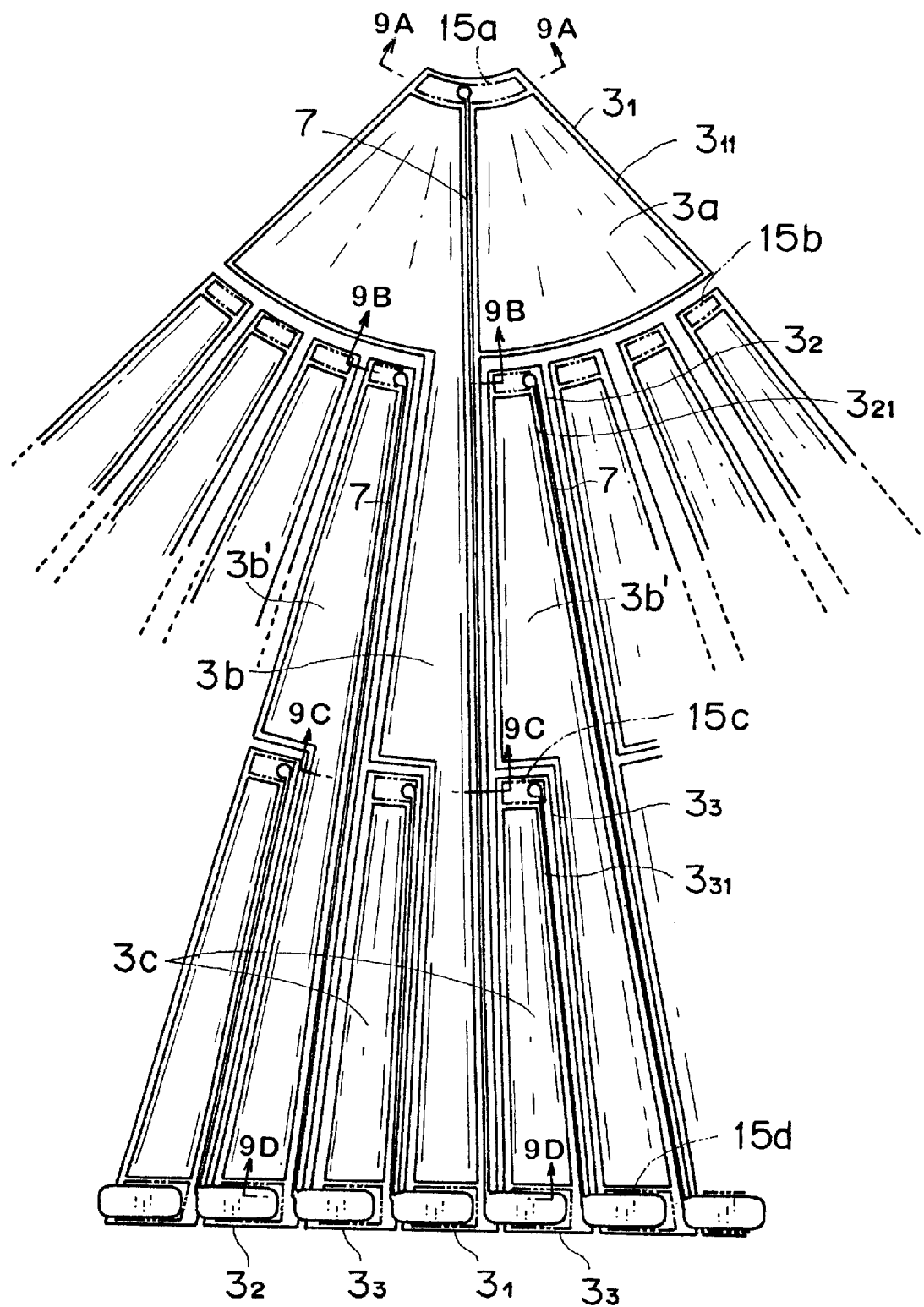
FIG. 8 is a partly enlarged plan view of the thermopile-type infrared sensor shown in FIG. 7.

The preferred embodiment No. 2 of thermopile-type infrared sensor according to the present invention is explained with reference to FIGS. 7 to 9. FIG. 7 is a partial plan view illustrating a half of a thermopile-type infrared sensor pattern. FIG. 8 is a partly enlarged plan view illustrating a quarter of the thermopile-type infrared sensor pattern. In FIGS. 7 and 8, a dielectric film and passivation film are not shown. FIGS. 9A, 9B, 9C and 9D are sectional views taken along A—A, B—B, C—C and D—D lines in FIG. 8, respectively, in which a dielectric film is shown.

In the preferred embodiment No. 2, thickness of the n-type polycrystalline silicon layers is enlarged in order to raise the S/N ratio by decreasing resistivity of the n-type polycrystalline silicon layers $3_1$, $3_2$ and $3_3$ of the preferred embodiment No. 1. FIG. 7 is a partial plan view illustrating a thermopile-type infrared sensor pattern according to the preferred embodiment No. 2. A single crystalline silicon substrate having a cavity is used, on both sides of which dielectric films are formed similarly to the preferred embodiment No. 1. There are two methods for forming the n-type polycrystalline silicon layer, i.e. the thermoelectric material, which is formed on the dielectric film as follows: ① method of forming one thick layer of the n-type polycrystalline silicon and ② method of forming two layers of n-type polycrystalline silicon, thereby making the layer thick.

A thermopile-type infrared sensor according to the preferred embodiment No. 2 is explained with reference to FIG. 7. Similarly to the case of the preferred embodiment No. 1, the n-type polycrystalline silicon layers $3_1$, $3_2$ and $3_3$ are radially placed from a chip center on the dielectric film and formed separately each other like islands. Then, the n-type polycrystalline silicon layers $3_1$, $3_2$ and $3_3$ are subjected to a patterning using a smaller pattern compared to the pattern of the n-type polycrystalline silicon layers $3_1$, $3_2$ and $3_3$ (of the preferred embodiment No. 1) shown in FIG. 3A, then followed by etching, thereby forming mesa-shaped n-type polycrystalline silicon layers $3_{11}$, $3_{21}$ and $3_{31}$. Then, the patterns of the n-type polycrystalline silicon layers $3_1$, $3_2$ and $3_3$ are formed, thereby making the periphery thereof to have a tapered step-like shape. Then a dielectric film 4 is formed thereon followed by making contact holes therein, then a metal film layer is deposited by sputtering followed by patterning, thereby hot junctions Ta and cold junctions Tb are formed by making a contact between the n-type polycrystalline silicon layer and the metal film layer at each contact hole. The periphery of these n-type polycrystalline silicon layers are formed to have a tapered step-like shape, avoiding a steep difference in level and preventing a disconnection of wiring with respect to the metal film layer around the periphery of the n-type polycrystalline silicon layers from occurring.

In the following, ① method of forming a thick n-type polycrystalline silicon single layer is explained. A dielectric film 2a is formed on the single crystalline silicon substrate, on which a non-doped polycrystalline silicon layer having thickness of 0.1 to 2 μm is then formed by LP-CVD or sputtering method, on which a n-type polycrystalline silicon layer having resistivity of 1 to 10 mΩ·cm is further formed by doping phosphorus at 800 to 1150° C. using POCl$_3$ as an impurity source. Thus formed n-type polycrystalline silicon layer is relatively thick. Then, PSG on a surface of the n-type polycrystalline silicon layer is removed by using buffer hydrofluoric acid, followed by forming the mesa-shaped n-type polycrystalline silicon layers $3_{11}$, $3_{21}$ and $3_{31}$ by patterning using a similar but smaller pattern compared to the pattern used in the preferred embodiment of No. 1 and then, step-shaped n-type polycrystalline silicon layers $3_1$, $3_2$ and $3_3$ are formed by patterning using the same pattern as that of the n-type polycrystalline silicon layers of the preferred embodiment No. 1. Then, through the process explained in the preferred embodiment No. 1, a passivation film and infrared absorption film and the like are formed, thereby a thermopile-type infrared sensor is produced.

In the following, method ② of forming two layers of n-type polycrystalline silicon to form a thick layer is explained with reference to FIGS. 7 to 9. In method ②, an upper layer of the polycrystalline silicon between the two layers thereof is formed in such a manner as covering a lower patterned layer of the polycrystalline silicon, thereby giving about the same shape as that described in method ①. In method ②, the n-type polycrystalline silicon layers $3_1$, $3_2$ and $3_3$ are formed in the upper and lower layers of the polycrystalline silicon, while the n-type polycrystalline silicon layers $3_{11}$, $3_{21}$ and $3_{31}$ are formed in the lower layer of the polycrystalline silicon. A dielectric film 2a is formed on the single crystalline silicon substrate, on which a non-doped polycrystalline silicon layer having thickness of 0.1 to 2 μm is formed by LP-CVD or sputtering method. Then, a pattern of polycrystalline layers separating each other is formed by using a mask that is used for patterning the n-type polycrystalline silicon layers $3_{11}$, $3_{21}$ and $3_{31}$. Then, another non-doped polycrystalline silicon layer having thickness of 0.1 to 2 μm is formed thereon. Then, phosphorus is doped into these polycrystalline silicon layers at 800 to 1150° C. using POCl$_3$ as an impurity source. Then, a pattern of the n-type polycrystalline silicon layers $3_1$, $3_2$ and $3_3$ having resistivity of 1 to 10 mΩ·cm is formed by patterning using the pattern of the n-type polycrystalline silicon layers $3_1$, $3_2$ and $3_3$. Through the above process, the n-type polycrystalline silicon layers $3_1$, $3_2$ and $3_3$ are radially formed with respect to a chip center on the insulation layer, on which a pattern of the n-type polycrystalline silicon layers $3_{11}$, $3_{21}$ and $3_{31}$ that is similar in shape but smaller than that of the n-type polycrystalline silicon layers $3_1$, $3_2$ and $3_3$, is also formed. Then, a dielectric film is formed thereon followed by making contact holes therein, then each hot junction Ta and cold junction Tb of each thermoelectric element having the n-type polycrystalline silicon as a thermoelectric material are formed and then, a series of the thermoelectric elements, in which each thermoelectric element is connected in series, is produced.

Here, the n-type polycrystalline silicon layer as the thermoelectric material may be formed by forming two layers of the non-doped polycrystalline separately each other followed by impurity dispersion thereinto, or may be formed by doping the impurity into each polycrystalline silicon layer thereby forming two layers of the n-type polycrystalline silicon.

Figure 9A:
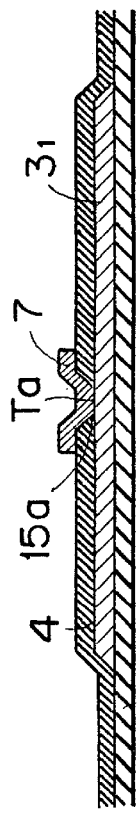
FIGS. 9A, 9B, 9C and 9D are sectional views taken along A—A, B—B, C—C and D—D lines in FIG. 8, respectively.
Figure 9B:
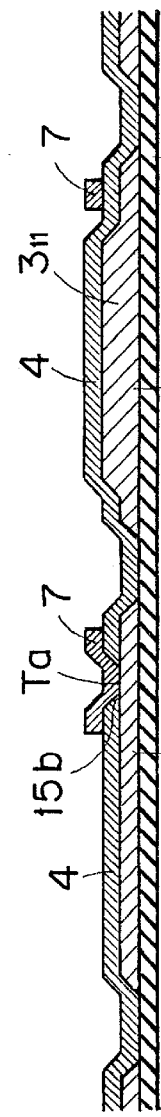
Figure 9C:
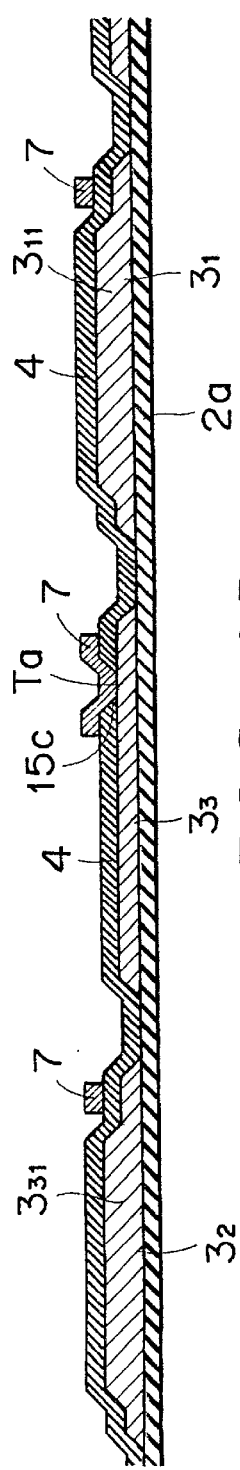
Figure 9D:
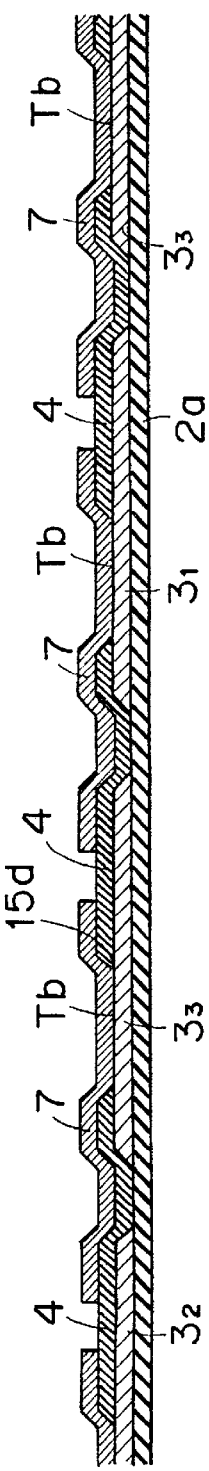

In the following, the preferred embodiment No. 2 is explained in further detail. As shown in FIG. 9A, the n-type polycrystalline silicon layer $3_1$ is connected with the metal film layer 7 at the contact hole 15a formed on the insulation layer 4 on the n-type polycrystalline silicon layer $3_1$ thereby the hot junction Ta on the n-type polycrystalline silicon layer $3_1$ is formed. As shown in FIGS. 9B and 9C, the metal film layer 7 extends toward the periphery of the chip on the dielectric film 4 on the n-type polycrystalline silicon layer $3_1$ without passing through on the n-type polycrystalline silicon layer $3_{11}$ and makes contact with the n-type polycrystalline silicon layer $3_3$ at the contact hole 15d, thereby forming the cold junction Tb, as shown in FIG. 9D. As shown in FIG. 9B, the n-type polycrystalline silicon layer $3_2$ makes contact with the metal film layer 7 at a contact hole 15b form the hot junction Ta, while as shown in FIG. 9C, the metal film layer 7 passes through on the n-type polycrystalline silicon layer $3_2$ covered with the dielectric film 4, then as shown in FIG. 9D, makes contact with the n-type polycrystalline silicon layer $3_3$ at a contact hole 15d, thereby forming the cold junction Tb. As shown in FIG. 9C, the metal film layer 7 makes contact with the n-type polycrystalline silicon layer $3_3$ at a contact hole 15c formed in the dielectric film 4 on the n-type polycrystalline silicon layer $3_3$, thereby forming the hot junction Ta, which is then connected to a adjacent cold junction Tb on the n-type polycrystalline silicon layer $3_1$ after passing through on the dielectric film 4. Thus, as shown in FIGS. 6A and 6B, a thermoelectric element, in which the hot and cold junctions are formed, are further provided with a passivation film and a infrared absorption film formed in such a manner as covering the hot junction, thereby producing a thermopile-type infrared sensor.

Similarly to the preferred embodiment No. 1, in this preferred embodiment No. 2, the pattern of the n-type polycrystalline silicon layers $3_1$, $3_2$ and $3_3$, is radially formed from a chip center on the dielectric film 2a in such a manner as complementing with each other and is uniformly placed, thereby making a stress distribution of a membrane structure uniform. The periphery of the n-type polycrystalline silicon layers is formed to have a tapered shape to avoid a steep difference in level.

Preferred Embodiment No. 3

Figure 10:
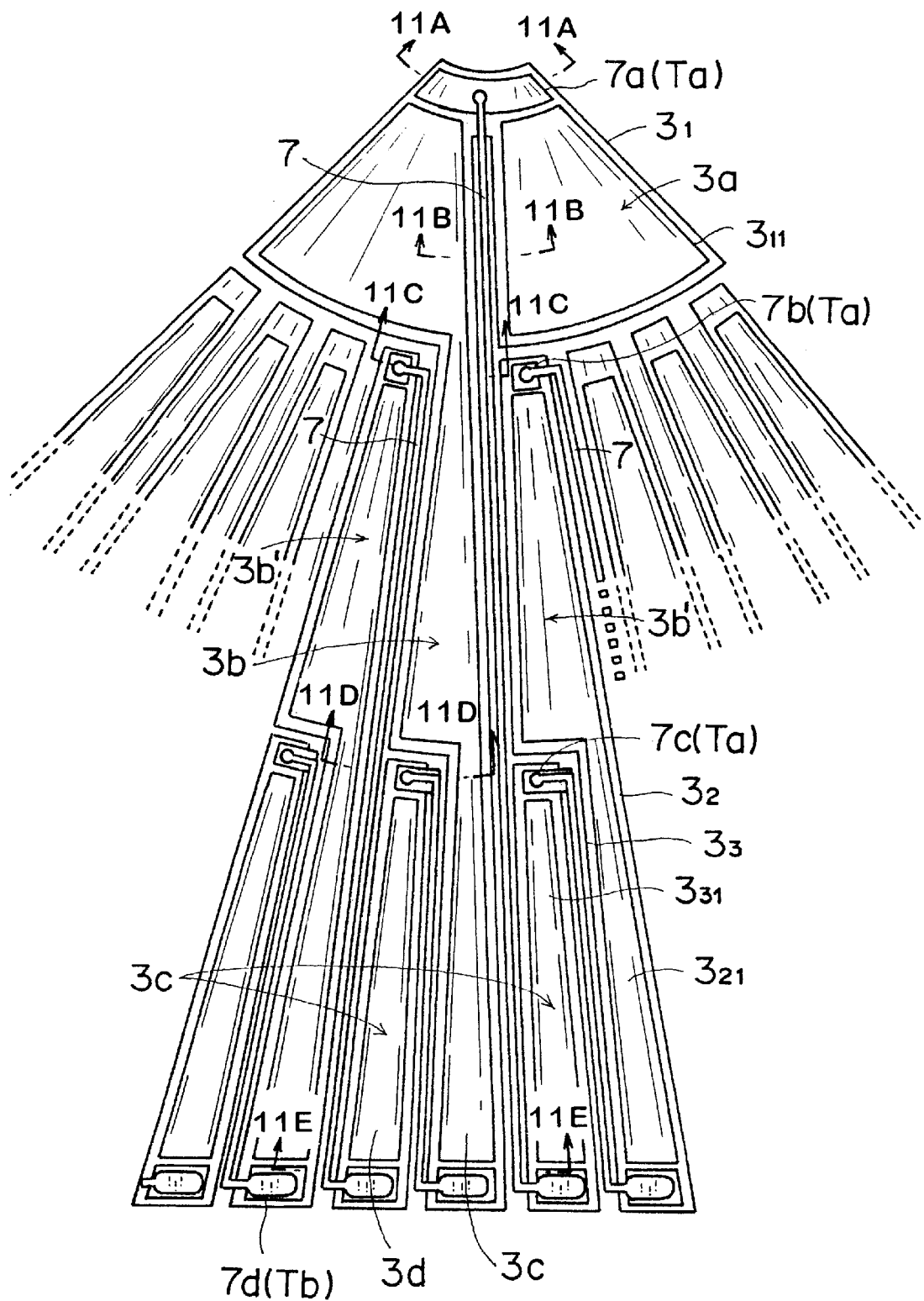
FIG. 10 is a partly enlarged plan view illustrating preferred embodiment No. 3 of thermopile-type infrared sensor according to the present invention.
Figure 11A:
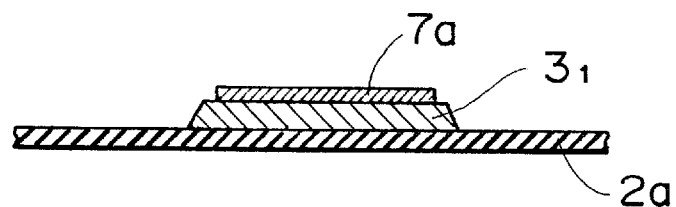
FIGS. 11A, 11B, 11C, 11D and 11E are sectional views taken along A—A, B—B, C—C, D—D and E—E lines in FIG. 10, respectively.
Figure 11B:
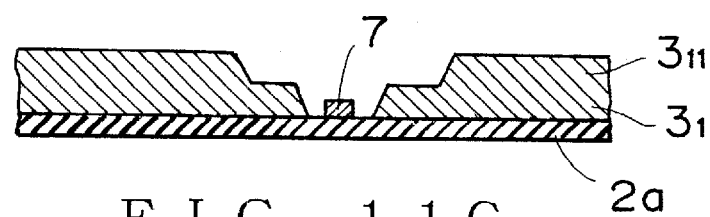
Figure 11C:
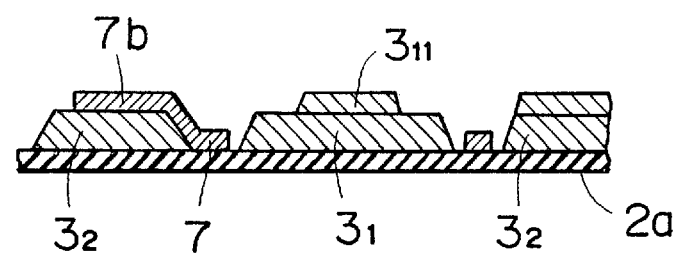
Figure 11D:
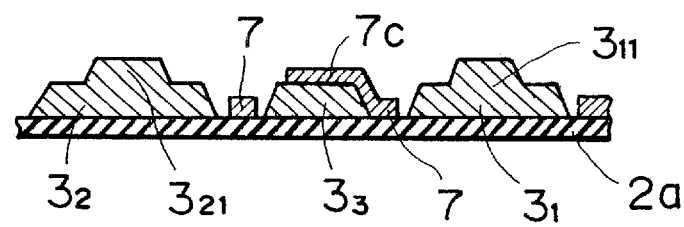
Figure 11E:
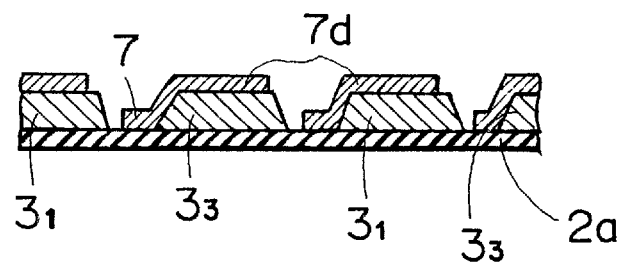

The preferred embodiment No. 3 of thermopile-type infrared sensor according to the present invention is explained with reference to FIGS. 10 and 11. FIG. 10 is a partly enlarged plan view illustrating a quarter of the thermopile-type infrared sensor pattern. FIGS. 11A, 11B, 11C, 11D and 11E are sectional views taken along A—A, B—B, C—C, D—D and E—E lines in FIG. 10, respectively. As shown in FIGS. 10 and 11, a metal film layer 7 is placed on a dielectric film 2a, thereby saving processes of covering the patterned n-type polycrystalline silicon layers with the dielectric film 4 and forming the contact hole 15 in the dielectric film 4. Consequently, a process for the preferred embodiment No. 2 is a process subtracting the process of formation of the dielectric film 4 from the process of the preferred embodiment No. 1, therefore a detailed explanation thereof is omitted.

Polycrystalline silicon layers are formed on dielectric films 2a on a single crystalline silicon substrate followed by an impurity diffusion, then n-type polycrystalline silicon layers $3_1$, $3_2$ and $3_3$, are formed by patterning through a process similar to the above process. Metal film layer 7, which composes a thermoelectric element and contribute as a wiring element, is connected to a cold junction Tb from a hot junction Ta passing through on the dielectric film 2a. Consequently, a pattern of the n-type polycrystalline silicon layers $3_1$ is a little different from that of the corresponding pattern that is described for the preceded preferred embodiments and is formed on the dielectric film 2a, with the n-type polycrystalline silicon layer directly under the wiring pattern of the metal film layer 7 being removed.

A pattern of the n-type polycrystalline silicon $3_1$, $3_2$ and $3_3$ is almost the same pattern with that of the preceded preferred embodiments, in which the pattern of the n-type polycrystalline silicon layer $3_1$, is a fan-shaped pattern 3a having a notch. The hot junction Ta is formed at a contact point 7a where the n-type polycrystalline silicon layer $3_1$ makes contact with the metal film layer 7. The metal film layer 7 extending from the hot junction Ta passes through on the dielectric film 2a that is exposed along a groove of the n-type polycrystalline silicon layer $3_1$, then makes contact with the cold junction Tb that is a contact point 7d with the metal film layer 7. Further, the metal film layer 7 passes through on the dielectric film 2a from a contact point 7b of the n-type polycrystalline silicon layer $3_2$, then makes contact with a contact point 7c of an adjacent n-type polycrystalline silicon layer $3_3$. Furthermore, the metal film layer 7 passes through on the dielectric film 2a from a contact point 7c of the n-type polycrystalline silicon layer $3_3$, then makes contact with a contact point 7d of an adjacent n-type polycrystalline silicon layer $3_2$. Thus, a series of thermoelectric elements, in which each thermoelectric element is connected in series, is formed.

In the preferred embodiment No. 3, a dielectric film for making a contact hole is not needed and the number of the process can be reduced, thereby a yield can be increased. The periphery portion of the n-type polycrystalline silicon is formed to have a step-shape, preventing a disconnection of wiring pattern of the metal film, and the n-type polycrystalline silicon layers and the metal film layers are uniformly placed on a chip surface, preventing a crack formation caused by a stress.

Preferred Embodiment No. 4

Figure 12:
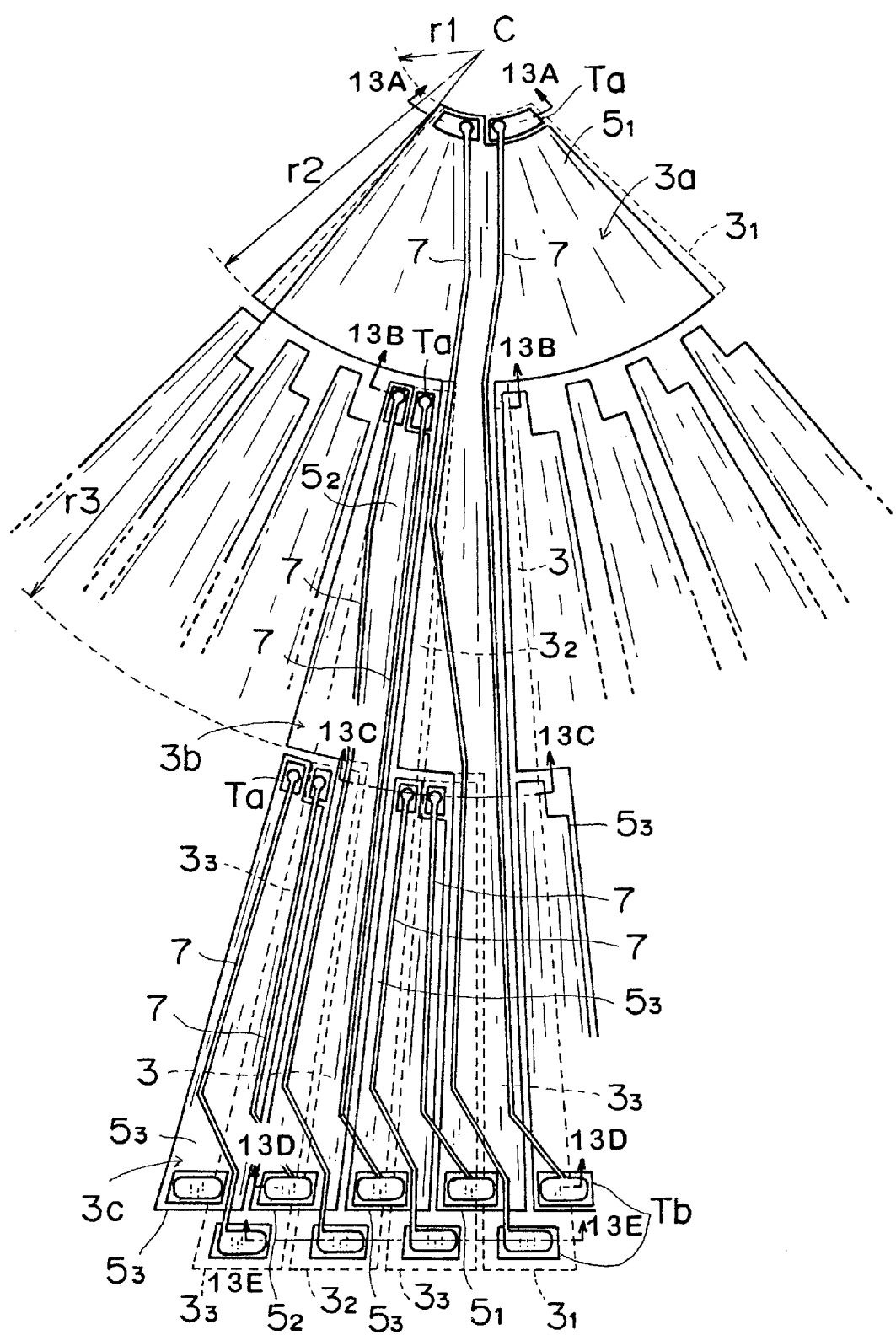
FIG. 12 is a partly enlarged plan view illustrating preferred embodiment No. 4 of thermopile-type infrared sensor according to the present invention.

The preferred embodiment No. 4 of thermopile-type infrared sensor according to the present invention is explained with reference to FIGS. 12 to 14. FIG. 12 is a partly enlarged plan view illustrating a quarter of the thermopile-type infrared sensor pattern. FIGS. 13A, 13B and 13C are sectional views taken along A—A, B—B and C—C lines in FIG. 12, respectively. FIGS. 14A and 14B are sectional views taken along D—D and E—E lines in FIG. 12, respectively. A dielectric film covering a thermoelectric element is not shown in FIG. 12, but shown in FIGS. 13 and 14. In FIG. 12, hot junctions Ta and cold junctions Tb formed by contact between a metal film layer and n-type polycrystalline silicon layer are shown as contact points, while contact holes formed in the dielectric films for making the hot junction Ta and cold junction Tb are not shown.

In the preferred embodiment No. 4, two layers of the n-type polycrystalline silicon, which are the material for the thermoelectric element, are formed with putting a dielectric film therebetween. The two layers of the n-type polycrystalline silicon each have the same pattern with that of the preferred embodiment No. 1 but are formed, in such a manner that a pattern of the one layer of the n-type polycrystalline silicon is shifted by half of a pitch toward the circumference of a chip with respect to a pattern of the another layer of the n-type polycrystalline silicon, with putting a dielectric film therebetween. If the same pattern with the preferred embodiment No. 1 shown in FIG. 1 is employed, 160 thermoelectric elements can be formed. However 80 thermoelectric elements are many enough, that is, making 40 thermoelectric elements for the first layer of n-type polycrystalline silicon and 40 thermoelectric elements for the second layer of n-type polycrystalline silicon, causing no practical problem.

In FIGS. 13 and 14, sectional views including the hot junctions Ta and the cold junctions Tb are shown. In the preferred embodiment No. 4, one of two layers of n-type polycrystalline silicon is formed to have step-shape forming a taper. A passivation film for covering the thermoelectric element and an infrared absorption film have the same embodiment with the preceded preferred embodiments mentioned above.

Similarly to the preferred embodiment No. 1, a number of the first layers of the n-type polycrystalline silicon layers $3_1$, $3_2$ and $3_3$ are radially formed in striped shape on a dielectric film 2a formed on a single crystalline silicon substrate, on which a dielectric film 4 is formed and then, the second layers of the n-type polycrystalline silicon $5_1$, $5_2$ and $5_3$ are formed in striped shape on the dielectric film 4. A pattern of the second layers of the n-type polycrystalline silicon $5_1$, $5_2$ and $5_3$ are formed to be shifted by half of a pitch with regard to the pattern of the first layers of the n-type polycrystalline silicon $3_1$, $3_2$ and $3_3$, on which a dielectric film 6 is formed. Contact holes are formed in the dielectric films 4 and 6 formed on the first layers of n-type polycrystalline silicon $3_1$, $3_2$ and $3_3$, while contact holes are also formed in the dielectric film 6 formed on the second layers of n-type polycrystalline silicon $5_1$, $5_2$ and $5_3$. These contact holes are formed to form hot and cold junctions of the thermoelectric elements. A metal film layer such as an aluminum film layer, is formed on the dielectric film 6 followed by a patterning, thereby forming metal film layers 7 that are one material for constructing the thermoelectric elements and function as wiring members. Contact points between the metal film layers 7 and the layers of n-type polycrystalline silicon $3_1$, $3_2$ and $3_3$ or the layers of n-type polycrystalline silicon $5_1$, $5_2$ and $5_3$ become the hot junctions Ta and cold junctions Tb of the thermoelectric elements.

A sectional view of the hot junction Ta is shown in FIGS. 13A to 13C, while that of the cold junction Tb is shown in FIGS. 14A and 14B. As shown in FIG. 14B, the metal film layers 7 are in contact with the layers of n-type polycrystalline silicon $3_1$, $3_2$ and $3_3$ at the contact holes formed in the dielectric film 4, thereby forming the cold junctions Tb of the first layers of n-type polycrystalline silicon $3_1$, $3_2$ and $3_3$. As shown in FIG. 14A, the metal film layers 7 are in contact with the layers of n-type polycrystalline silicon $5_1$, $5_2$ and $5_3$ at the contact holes formed in the dielectric film 6, thereby forming the cold junctions Tb of the second layers of n-type polycrystalline silicon $5_1$, $5_2$ and $5_3$. Then, the hot junction Ta of the second n-type polycrystalline silicon layers is connected to the cold junction Tb of the adjacent first layers of the n-type polycrystalline silicon by the metal film layer 7, thereby constructing a series of the thermoelectric elements, in which each thermoelectric element is connected in series. Further, a passivation film consisting of a dielectric film 8 and an infrared absorption film are formed at an membrane part, in which a number of hot junctions are formed, as shown in FIGS. 6A and 6B.

As is also the case of the preferred embodiments No. 1 to 3, an infrared absorption film consisting of borosilicate glass layer 9 is formed on the dielectric film 8 made of SiN, thereby improving an infrared absorption characteristic as an infrared sensor. A dielectric film 10 made of $SiO_2$ is formed for protecting the borosilicate glass layer 9 from an etching process upon formation of a heat-sensitive part consisting of the above infrared absorption film. A part of the dielectric film 8 is opened by etching followed by patterning, thereby an electrode pad 12 is formed in such a manner as overlapping with the dielectric film 8. As shown in FIG. 6B, an infrared absorption film 16 made of resin, such as a polyimide resin, vinyl resin and acrylic resin, may be formed at a center part of the membrane. Thus, even in this case of a single layer of the n-type polycrystalline silicon and two layer-structure of the n-type polycrystalline silicon, a passivation film and an infrared absorption film shown in FIG. 6 are formed.

In the following, a process for producing the thermopile-type infrared sensor according to the preferred embodiment No. 4 is explained with reference to FIGS. 12 to 14. Here, a process for forming the first layer of the n-type polycrystalline silicon $3_1$, $3_2$ and $3_3$ on the dielectric film 2a formed on both sides of the single crystalline silicon substrate is the same with the process described in the preceded preferred embodiments, therefore an explanation of said process is omitted and the following processes are explained in the following.

(1) The dielectric film 4 is formed on the first layers of n-type polycrystalline silicon $3_1$, $3_2$ and $3_3$ that are shown by dotted lines in FIG. 12. The dielectric film 4 made of $SiO_2$ having thickness of 0.1 to 2 μm is formed by LP-CVD method. Instead, the polycrystalline silicon may be thermally oxidized, forming $SiO_2$ layer having thickness of 10 to 100 nm on a surface of the polycrystalline silicon, thereby an interlayer insulator is formed as the dielectric film 4, improving interlayer insulation.

(2) Then, the second layers of the n-type polycrystalline silicon is formed as follows: the silicon substrate is heated up to 600 to 700° C.; then, the non-doped polycrystalline silicon film having thickness of 0.1 to 2 μm is formed on the dielectric film 4 by LP-CVD method; then, phosphorus ions are implanted by ion implantation followed by heat-treating at 800 to 1150° C. to diffuse the phosphorus. Through this doping of phosphorus, the non-doped polycrystalline silicon film becomes a doped polycrystalline silicon layer having resistivity of 1 to 10 mΩ·cm.

(3) A photoresist film having thickness of 1 to 4 μm is formed on the above n-type polycrystalline silicon layer and then, a patterning is performed using a second pattern that is the same with a first pattern used upon forming the first layers of the n-type polycrystalline silicon $3_1$, $3_2$ and $3_3$ but is shifted by half of a pitch in the circumference direction, which is shown by solid lines in FIG. 12, thereby a striped pattern is radially formed from the chip center toward the periphery of the chip. This radial pattern is the same with the striped pattern of the first layers of the n-type polycrystalline silicon $3_1$, $3_2$ and $3_3$, which is already formed underneath. By using this pattern as a mask and RIE method and the like, the n-type polycrystalline silicon is patterned to form the second layers of n-type polycrystalline silicon $5_1$, $5_{2\ and\ 53}$.

(4) The dielectric films 4 and 6 on edge portions of the striped patterns of the first layers of $3_1$, $3_2$ and $3_3$ and the second layers of $5_1$, $5_2$ and $5_3$ are patterned by photolithography followed by etching by RIE method, thereby forming the contact holes to form the hot and cold junctions.

(5) In order to form the hot and cold junctions on the first layers of n-type polycrystalline silicon $3_1$, $3_1$ and $3_3$ and the second layers of n-type polycrystalline silicon $5_1$, $5_2$ and $5_3$, respectively, a metal film layer 7 made of Ai—Si having thickness of 0.2 to 1 μm is formed by sputtering and then, patterned by photolithography followed by etching using phosphoric acid as an etchant, thereby each hot junction Ta is alternately connected to a corresponding cold junction Tb, and at the same time primary electrode pads, which are for forming external lead electrodes, are formed.

(6) After the metal film layers 7 are thus formed, the dielectric film 8 made of SiN or $SiO_2$ having thickness of 0.2 to 2 µm is formed by plasma CVD, on which the borosilicate glass layer having thickness of 0.3 to 3 µm is formed by sputtering. The glass layer 9 is heat-treated at 300 to 600° C. to reduce pin-holes and to prevent a problem of step coverage from occurring. This step for reducing pinholes is also effective in the preceded preferred embodiments.

(7) The dielectric film 10 made of $SiO_2$ having thickness of 0.5 to 2 µm m is formed on the above heat-treated glass layer 9 followed by patterning using photolithography and then, the borosilicate glass layer 9 and the dielectric film 10 are removed by etching with a central part of the membrane thereof left. Then, the dielectric film 8 on the electrode pad is removed by etching using photolithography and then, electrode pads 11 and 12 are formed by depositing Cr film having thickness of 50 to 300 nm and Au film having thickness of 100 to 500 nm, followed by patterning using lift-off method.

(8) The dielectric film 2b on the back of the substrate 1 is etched by photolithography to make an opening therein, then the single crystalline silicon substrate 1 is subjected to an anisotropic etching from the back thereof using an alkaline etchant to form a cavity 13, thereby a sensor chip, in which the membrane part 14 containing the hot junction that serves as an infrared ray-receiving part is formed, is produced.

In a final step, the infrared absorption film made of resin is formed by a method such as screen printing, ink jet, and a method, in which the resin is spin coated followed by curing and patterning by photolithography. In case of ink jet method, the resin film can be formed even after making the cavity. As the need arises, carbon and the like can be dispersed into the resin to improve the infrared absorption characteristic.

In the above preferred embodiments, a dielectric film formed on the metal film layer 7 may contain an element selected from a group consisting of PSG, $Al_2O_3$ and SIALON, in addition to SiO, SiN, and SiNO. A dielectric film that covers the metal film layer 7 may consist of PSG and SiN.

Figure 15:
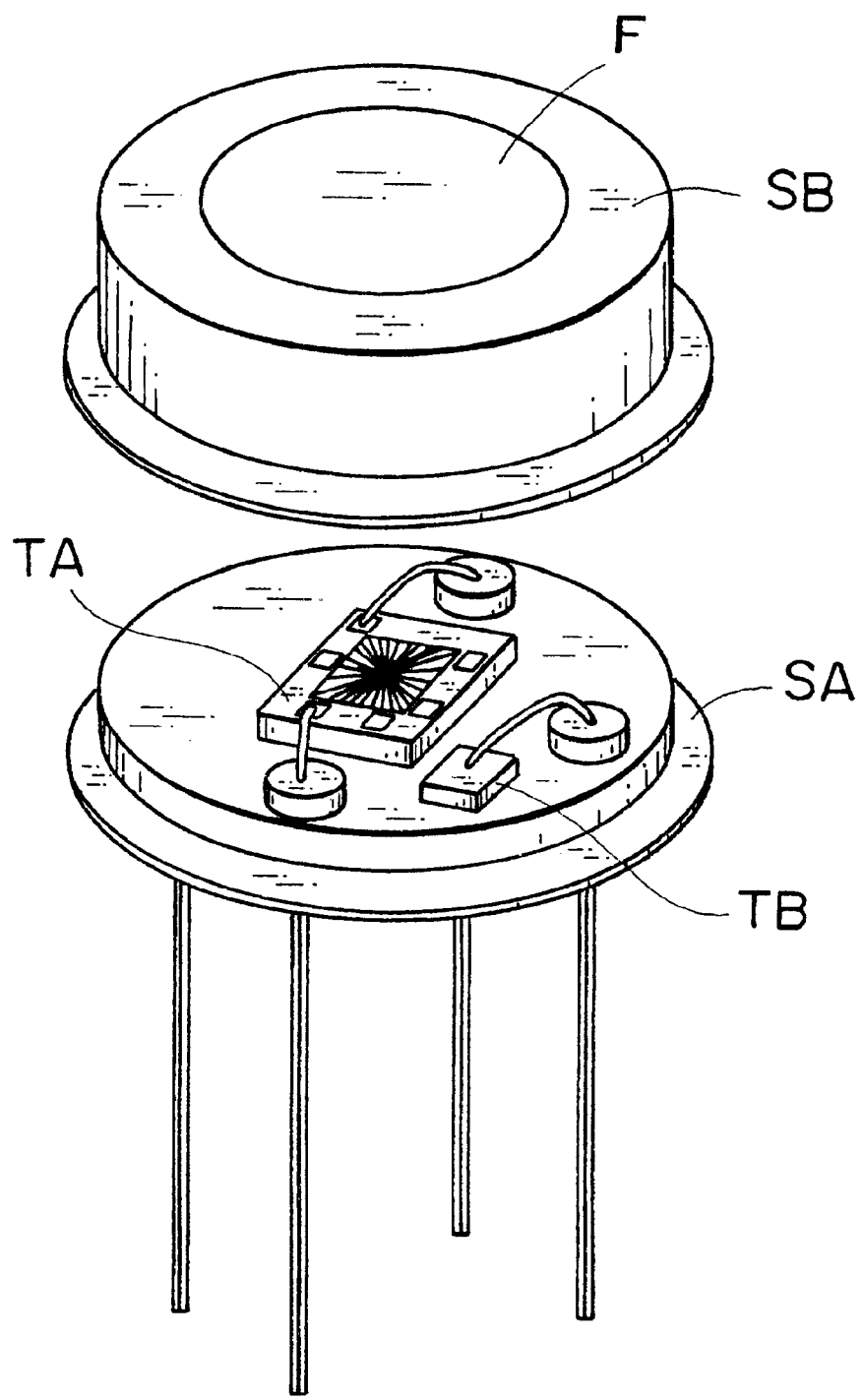
FIG. 15 is an exploded perspective view illustrating a package structure, in which a thermopile element is accommodated in a stem.

As shown in FIG. 15, the thermopile-type infrared sensor according to the preferred embodiments is enclosed in a package to be utilized as an infrared detector. FIG. 15 illustrates a state, in which a thermopile element TA is fixed on a stem SA. The stem SA is made of metal, such as Fe and Fe—Ni—Co. A hollow is formed around a center where the thermopile element TA is fixed.

The thermopile element TA is fixed on the stem by using glue having very high thermal conductivity. A thermistor chip TB, which is used for temperature compensation, is glued on the stem using an electroconductive paste. An electrode pad of the thermopile element TA is connected to an external electrode terminal formed on the stem by wire bonding using Au or Al—Si wire.

After the thermopile element TA and the thermistor chip TB are placed and fixed on the stem SA followed by electrical connecting therebetween, the stem SA is covered by a window-mounted cap SB, in which an infrared-transmissible filter material is glued and fixed to an opening of a cap using an epoxy glue or solder, and hermetically sealed by welding and the like. The inside of the package is sealed by filling gas having low thermal conductivity, such as dry nitrogen, Ar, Kr, and Xe, or vacuum-sealed, thereby reducing thermal conduction from the membrane part of the thermopile element to the surroundings through the above gas, and resulting in high-output infrared detector.

On the other hand, an infrared ray-transmissible filter member F to be a window is mounted on the cap SB. The filter member F is expensive because it consists of multi-layer having scores of layers consisting of ZnS or Ge and the like in order to control the transmittance, which is formed on a silicon substrate or Ge substrate. Consequently, a package size and a filter size are needed to be small in order to produce an inexpensive infrared sensor. However, small size of the filter causes the incident infrared ray to decrease, causing deterioration of the output of the sensor.

Figure 16A:
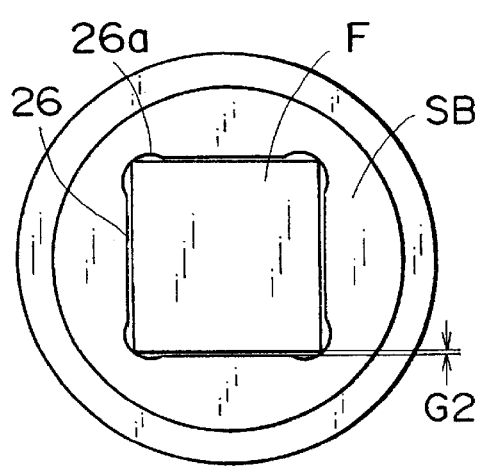
FIGS. 16A and 16C are front views of a cap for accommodating the thermopile element.
Figure 16C:
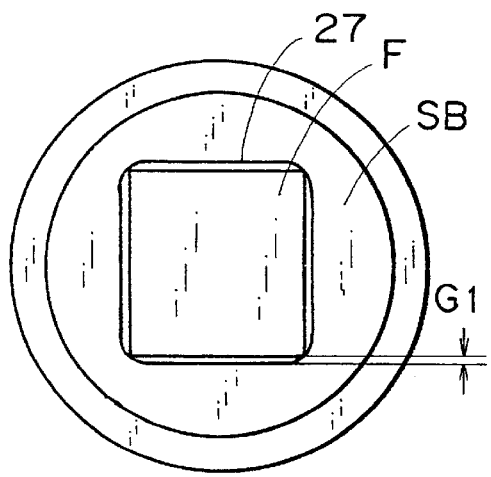
Figure 16B:
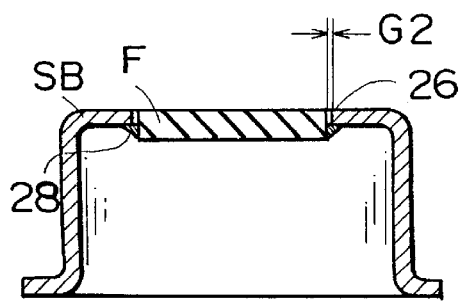
FIGS. 16B and 16D are sectional views of the cap.
Figure 16D:
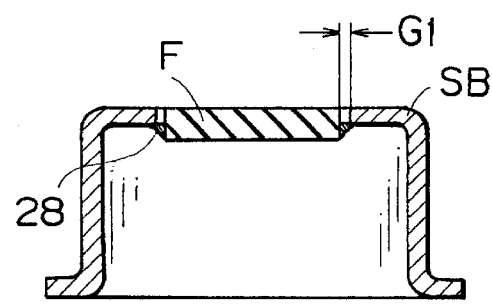

In these respects, a cap structure that can effectively utilize a filter size as much as possible is explained with reference to FIGS. 16C and 16D. The window-mounted cap SB has an opening 27, into which the infrared ray-transmissible filter member F is fitted. If a shape of the opening 27 is round, there is no problem in producing the cap by using a press-mold. However, if the shape of the opening 27 is quadrilateral or hexagonal having corners, a roundness is occurred at each corner.

For example, when the opening 27 is square having each side of 2 mm, the roundness at the corner of the opening 27 has a radius of at least 0.2 to 0.3 mm. A gap G1 between the opening and the window becomes about 0.06 mm and 0.1 mm for the radius of 0.2 mm and 0.3 mm, respectively. Taking an accuracy of finishing into consideration, the gap becomes even larger.

Thus, the roundness is formed at the corners of the opening, thereby fitting the corner of the filter member F into the opening 27, enlarging the gap G1. An occurrence of the gap G1 requires much amount of adhesive to glue the filter member F with the opening 27. Since the adhesive can be leaked out to the incident side of infrared ray, the following structure of the window-mounted cap SB shown in FIGS. 16A and 16B is preferable. However, in such a case, the gap may be filled with resin.

In FIGS. 16A and 16B, the window-mounted cap SB has an opening 26, into which the infrared ray-transmissible filter member F is fitted. At each corner of the opening 26, there is formed a round or a curved notch 26a, into which each corner of the filter member F that is made by dice cutting is fitted, thereby the filter member is fitted into the opening 26. A gap G2 between the filter member F and the cap SB can be set to be a dimension in which an allowable error is taken into consideration and to be very small.

Thus, at corners of the opening 26, the notch 26a is formed toward outside compared to an intersection point of each side of the square, preventing the window member F from being caught in the opening 26, thereby allowing a gap between the opening and the window member at said corner to be small. Consequently, reliability of hermetic seal is improved, allowing the leakage of the adhesive 28 out to a surface of the window member to be minimal.

Figure 17A:
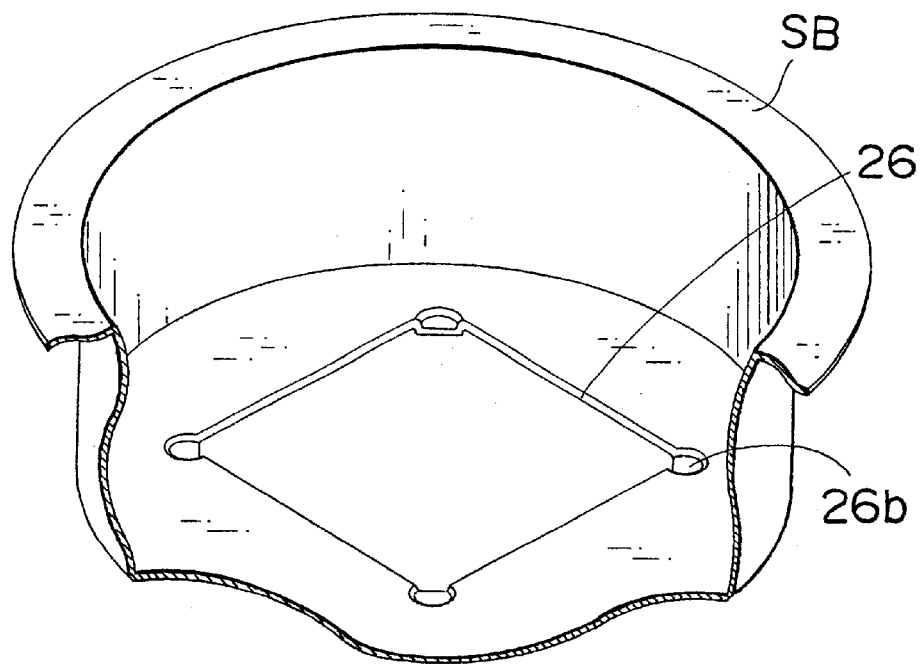
FIGS. 17A and 17B are partly broken perspective views of the cap viewed from the back and front, respectively.
Figure 17B:
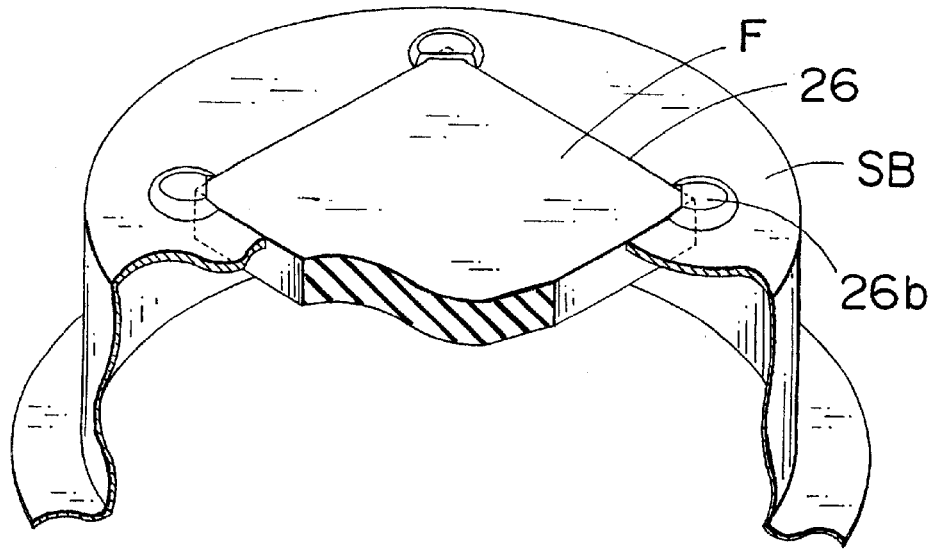

In the following, a structure of the window-mounted cap is explained with reference to FIGS. 17A and 17B that are partly broken perspective views of a window-mounted cap viewed from the back and front, respectively. FIG. 17A is a perspective view of the cap structure, in which an opening for mounting a window member is formed, viewed from the cap inside, while FIG. 17B is a perspective view of the cap structure, in which the window member is mounted.

In the cap SB, there is formed a quadrilateral opening 26, at each corner of which a hollow 26b is formed in such a manner protruding toward outside from the back of the cap. By controlling a depth of the hollow 26b, the window member F is fitted into the opening 26, thereby a face (an incident surface of infrared ray) of the window member F coincides with the front face of the cap SB. Although the face of the window member F does not necessarily coincide with the front face of the cap SB upon fitting into the opening 26, a fitting without making any difference in level is preferable. Then, the periphery of the window member F and the hollows 26b are filled with a resin from the back of the cap SB to fix the window member F at the opening 26 of the cap. The opening 26 coincides with the window member F in dimension. The window member F abuts on the bottom of the hollow at each corner and is fixed there. According to this example, a whole face of the window member serves as a face, on which infrared ray can be absorbed, enabling a small size of the window member compared to a conventional window member and cost reduction in the window member that has been conventionally expensive.

Figure 18A:
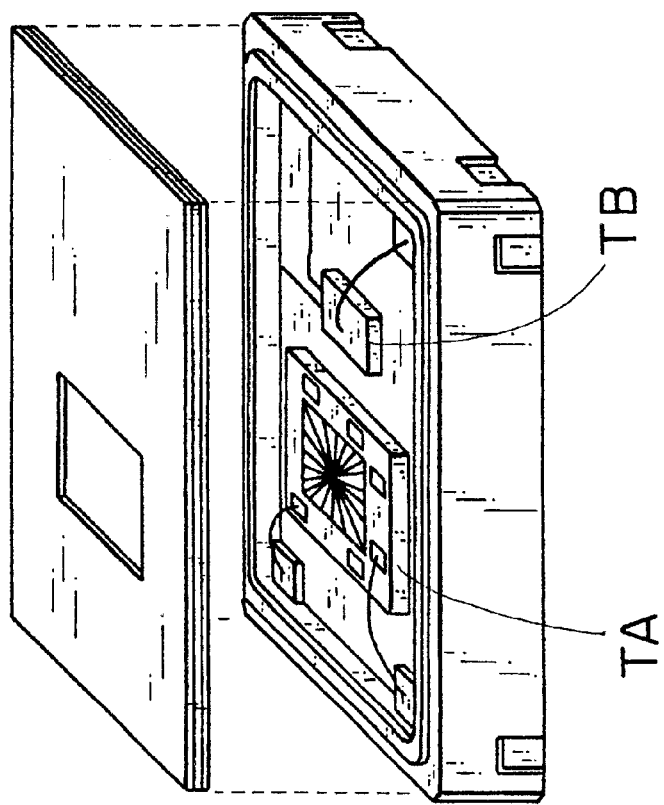
FIGS. 18A and 18B are exploded perspective views illustrating a package structure, in which a thermopile element is accommodated in a ceramic package.
Figure 18B:
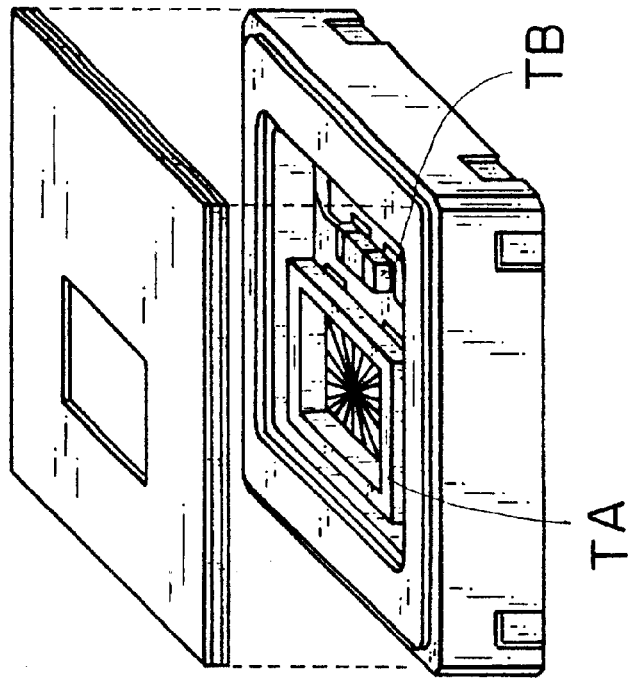

In FIG. 18A, shown is an example of package structure, in which a thermopile element is accommodated in a ceramic package such as alumina package, and the thermopile element TA and the thermistor chip TB are subjected to wiring by wire bonding. In FIG. 18B, shown is an example of package structure, in which the thermopile element TA is placed in a ceramic package in such a manner that a cavity side of the thermopile element TA is a face of infrared ray-receiving, and a surface mount type of the thermistor chip TB is employed. Alumina having high thermal conductivity of about 20 W/m·K allows temperature distribution generated in the package to be reduced, thereby reducing a measurement error in temperature, when used as a casing of the infrared detector. The package material is not limited to alumina. If AlN having thermal conductivity as high as 170 W/m·K is used, further better characteristic can be obtained. When the package structure like that shown in FIG. 18B, the borosilicate glass and the infrared absorption film are preferably formed on the side of the cavity.

Figure 20A:
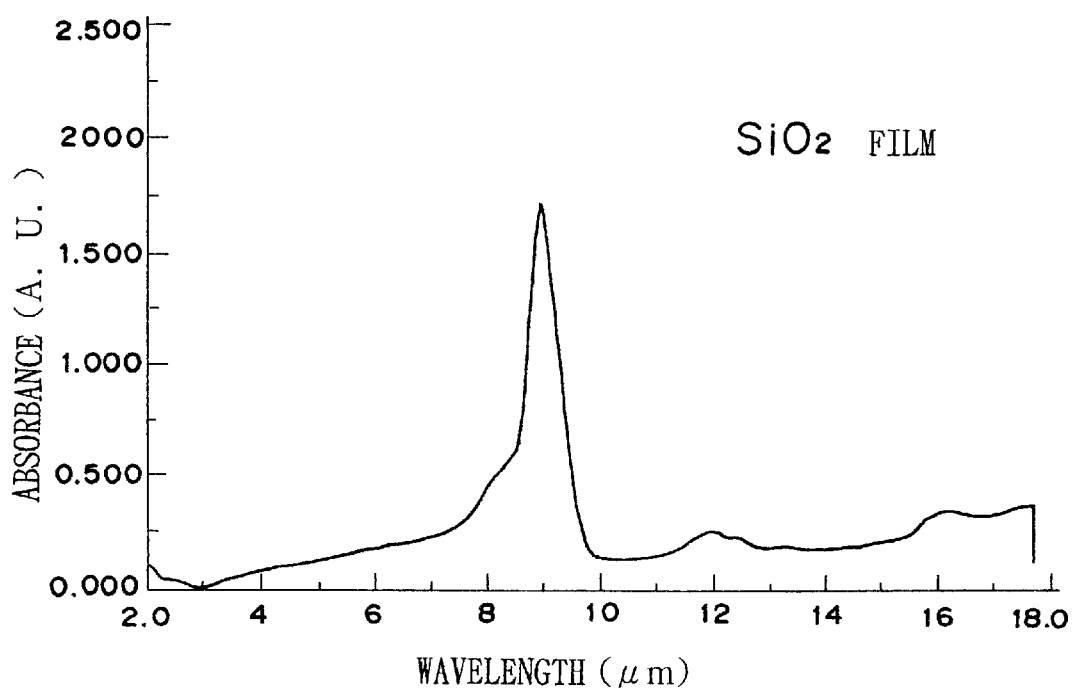
FIGS. 20A and 20B are infrared absorption spectra of thermopile-type infrared sensor according to the present invention.
Figure 20B:
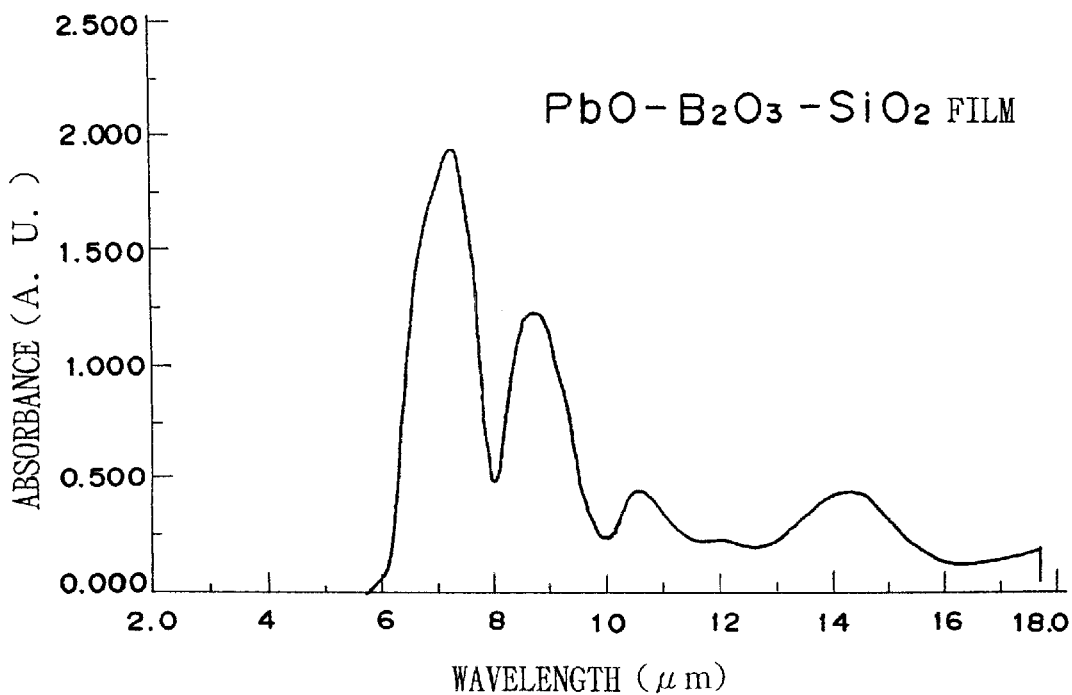
Figure 21:
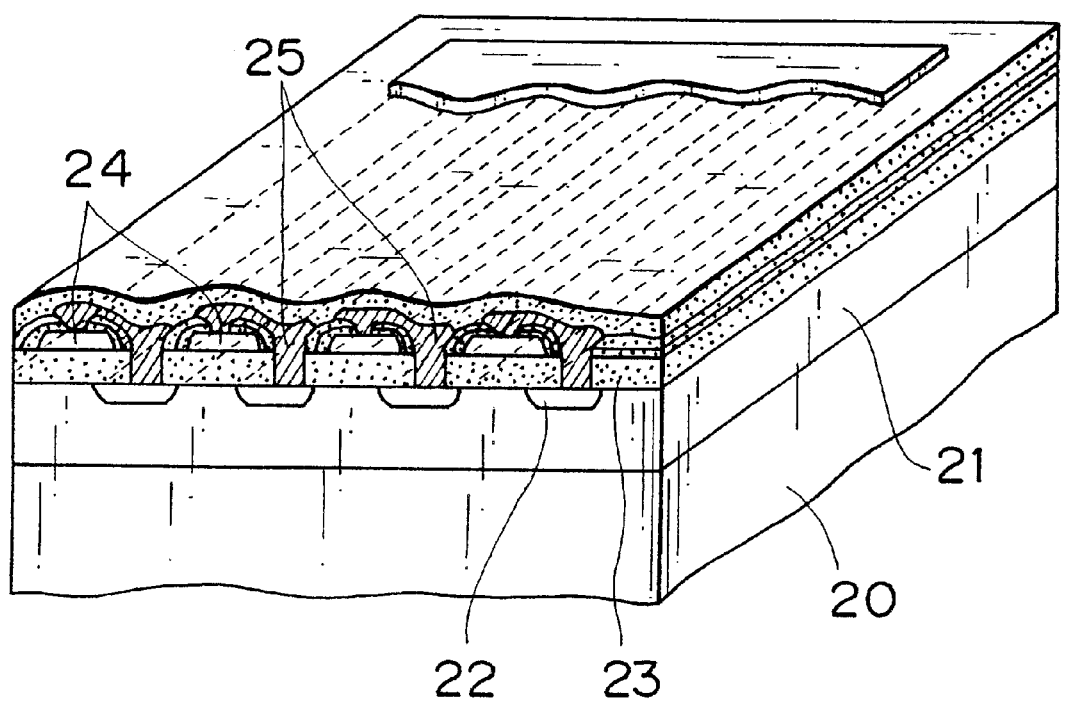
FIG. 21 is a perspective view illustrating a primary part of a conventional thermopile element.

In the following, infrared absorption spectra of the thermopile-type infrared sensor according to the present invention are explained with reference to FIG. 20. FIG. 20A shows an infrared absorption spectrum when $SiO_2$ film is formed at the membrane part and FIG. 20B shows an infrared absorption spectrum when a lead borosilicate glass film is formed at the membrane part. As is seen in FIG. 20B, when the lead bolosilicate glass is used as the bolosilicate glass 9, there are absorption bands in wavelength region of about 6 to 11 $\mu$m (about -10 to 210° C. on a temperature basis). While, in the case of the $SiO_2$ film, as is seen in FIG. 20A, there are absorption bands in wavelength region of about 8 to 9.5 $\mu$m (about 30 to 90° C. on a temperature basis). Consequently, when the bolosilicate glass is used as a material for the dielectric film, which is described in the thermopile-type infrared sensor according to the preferred embodiments, wider temperature range can be detected compared to a conventional case, in which the $SiO_2$ film is used as a material for the dielectric film. Further, when SiN film is used as the passivation film, there are absorption bands in wavelength region of about 10 to 12 $\mu$m, which can be shifted to shorter wavelength by using SiNO film by introducing oxygen upon film formation. Therefore, by combining the SiNO film with the borosilicate glass film, the absorption band range can be wider, thereby further improving the sensitivity of the sensor. In the above example, lead borosilicate glass film is employed as the borosilicate glass film. However, other element instead of lead may be added and followed by heat-treatment. A borosilicate glass without addition of such an element may also be employed.

In the above preferred embodiments, 80 thermoelectric elements are produced per one layer of n-type polycrystalline silicon. It is possible to change the number of thermoelectric elements produced by changing radius of the concentric circles around the chip center and the width of the pattern. In the preferred embodiment No. 2, a thermopile-type infrared sensor having S/N ratio of 84 dB was produced on a condition of infrared ray-receiving power density of 1.25 mW/cm².

Since the thermopile-type infrared sensor according to the present invention is small and enables accurate non-contact measurement of temperature, it is most suitable to a sensor for use in such a clinical thermometer in which a body temperature is measured at person's ear, which can quickly measure person's body temperature.

In the present invention, a plurality of rows of thermoelectric elements may be formed on the substrate followed by connection of the rows of thermoelectric elements in series at the outside.

Thus, according to the present invention, the n-type polycrystalline silicon layer is used as a thermoelectric material, thereby using electrons as carriers having high mobility compared to that of carriers in a p-type polycrystalline silicon, obtaining high Seebeck coefficient on a condition of the same resistivity and then, improving the S/N ratio, i.e. ratio of output voltage to Johnson noise. As described in the preferred embodiments No. 1 to 3, the hot junctions are placed on the concentric circles having radius $r_1$, $r_2$ and $r_3$ from a center of the cavity of the thermopile element in a relation of $r_1<r_2<r_3$, thereby relaxing a concentration of stress in the membrane part due to the n-type polycrystalline silicon layer, and the width of the stripe of the n-type polycrystalline silicon layer is formed to be wide as much as possible, thereby reducing the resistivity of the thermopile element. Consequently, the S/N ratio is increased, the yield upon the anisotropic etching is improved due to the reduction of the stress in the membrane, thereby enabling a production of inexpensive thermopile elements.

As described in the preferred embodiment No. 4, the double layers of the n-type polycrystalline silicon is formed through the dielectric film, or the upper and lower silicon layer patterns are formed by shifting half of a pitch with each other, and the hot junctions are placed on the concentric circles having radius $r_1$, $r_2$ and $r_3$ from a center of the cavity of the thermopile element in a relation of $r_1<r_2<r_3$, thereby relaxing a concentration of stress in the membrane part due to the n-type polycrystalline silicon layer. When the double layers of n-type silicon having same number of the hot junctions in the preferred embodiments No. 1 to 3 is formed with shifting half of a pitch with each other, the width of the stripe can be widely formed, thereby reducing the resistivity of the thermopile element. As a result, the S/N ratio is further improved and the yield upon anisotropic etching is also improved due to the reduction of the stress in the membrane, thereby enabling the production of inexpensive thermopile elements and also inexpensive thermopile-type infrared sensor.

According to the present invention, as a material composing the thermopile element, the resistivity of the n-type polycrystalline silicon film is 1 to 10 m$\Omega$·cm so as to increase the output voltage and the Seebeck coefficient, thereby reducing a temperature dependence of the voltage sensitivity. That is, if the resistivity of the n-type polycrystalline silicon film is lower than 1 m$\Omega$·cm, the Seebeck coefficient becomes small, resulting in that a practical output voltage cannot be obtained. In order to increase the output voltage, the number of the junctions must be increased, causing a length of the thermopile element to become long and causing a deterioration of the yield of the production. If the resistivity of the n-type polycrystalline silicon film is higher than 10 mΩ·cm, the Seebeck coefficient becomes large but the Johnson noise also becomes large, causing a deterioration of the S/N ratio.

The resistivity of the n-type polycrystalline silicon film is set to be 1 to 10 mΩ·cm so as to obtain adequate parameters such as the number of the thermoelectric elements, pattern shape of the n-type polycrystalline silicon film, position of the hot junctions, and the S/N ratio of the sensor, providing an advantage of mass production from the viewpoint of the production yield.

The shape of the pattern edge of the n-type polycrystalline silicon layer is formed to be in the step-shape or the tapered shape, relaxing a limitation with respect to the step coverage of a film formed on the n-type polycrystalline silicon layer, thereby allowing the thickness of the polycrystalline silicon layer to be increased. Further, the difference in level of the step is decreased, enabling a thin film formation on the polycrystalline silicon layer, thereby solving the problem of disconnection of the metal film on the step.

As the infrared absorption film, borosilicate glass or SiNO is used to improve the output of the infrared sensor by a factor of 30% compared to a conventional infrared absorption film made of $SiO_2$. Compared to a case of using an infrared absorption film made by resin, the infrared absorption film made of borosilicate glass or SiNO can be formed before etching, thereby reducing the production cost of the thermopile elements.

Ceramics such as $Al_2O_3$ and AlN are used as the package material so that the inexpensive and small thermopile element having the stable characteristic with respect to temperature change can be produced.

By using a chip thermistor or thin film thermistor, in which a resistivity is classified by a narrow deviation, as a cold junction temperature compensation element, when the infrared sensor according to the present invention is used as a non-contact temperature sensor, temperature of an object can be accurately measured and man-hour for calibration upon outgoing inspection can be reduced.

The surface of the infrared absorption film is formed in striped shape on the thermoelectric element, thereby restraining reflection of infrared ray and raising the absorbency of infrared ray so as to improve the detection efficiency thereof, and improving the S/N ratio of the infrared sensor.

Since an expensive window material may be mounted in the cap, in order to use such a window material effectively as much as possible, the opening is formed in the cap, providing an inexpensive infrared sensor. The hollows formed at the corners of the opening are effective to firmly fix the window to the cap and to seal an inert gas filled in the cap.

The aforementioned preferred embodiments are described to aid in the understanding of the present invention, and variations may be made by one skilled in the art without departing from the spirit and scope of the present invention.

What is claimed is:

1. A thermopile infrared sensor, in which thermoelectric elements are formed on a single crystalline silicon substrate containing a cavity therein, comprising,
   a first dielectric film covering the cavity;
   a plurality of n-type polycrystalline silicon layers formed on the first dielectric film, extending radially from the vicinity of a chip center; and
   metal film layers formed in contact with the n-type polycrystalline silicon layers, wherein hot junctions are formed at the central side of the chip and cold junctions are formed at the periphery of the substrate, respectively, by contacting the n-type polycrystalline silicon layer and the metal film layer, a plurality of the n-type polycrystalline silicon layers are radially arranged so that the hot junctions are arranged at the central side of the chip and also successively arranged from the central side of the chip to the periphery of the chip, and at least one series of thermoelectric elements is formed on the first dielectric film by connecting alternately and successively, by the metal film layer, said hot junction and cold junction of the neighboring n-type polycrystalline silicon layer.

2. The thermopile infrared sensor as in claim 1, wherein an infrared absorption film is formed on a dielectric film that covers said series of thermoelectric elements.

3. The thermopile infrared sensor as in claim 2, wherein the infrared absorption film formed on the series of thermoelectric elements consists of one member selected from the group consisting of borosilicate glass, polyimide resin, vinyl resin and acrylic resin.

4. The thermopile infrared sensor as in claim 2, wherein a surface of the infrared absorption film has a striped pattern having unevenness.

5. The thermopile infrared sensor as in claim 1 wherein a crystallographic plane of the single crystalline silicon substrate is (100).

6. The thermopile infrared sensor as in claim 1, wherein the n-type polycrystalline silicon layers radially placed from a chip center have combination of fan-shaped patterns, striped shaped patterns and hook-shaped patterns extending toward a chip periphery.

7. The thermopile infrared sensor as in claim 1, wherein the hot junctions are place don concentric circles of radius $r_1$, $r_2$ and $r_3$ with respect to a chip center in a relation of $r_1 < r_2 < r_3$.

8. The thermopile infrared sensor as in claim 1, wherein the dielectric film covering the thermoelectric elements consists of two layers of phosphosilicate glass and SiN.

9. The thermopile infrared sensor as in claim 1, wherein the first dielectric film consists of two layers of $SiO_2$ and SiN, or three layers consisting of a SiN layer sandwiched by $SiO_2$ layers.

10. The thermopile infrared sensor as in claim 1, wherein peripheral portions of the n-type polycrystalline silicon layers are formed in a step-shape except portions on which the hot and cold junctions are formed.

11. The thermopile infrared sensor as in claim 1, wherein cross sections of periphery of the n-type polycrystalline silicon layers are in a tapered-shape.

12. The thermopile infrared sensor as in claim 1, wherein a resistivity of the n-type polycrystalline silicon layers is 1 to 10 mΩ·cm.

13. The thermopile infrared sensor as in claim 1, wherein the dielectric film covering the thermoelectric elements contains at least one member selected from the group consisting of $SiO_2$, SiN, SiNO, phosphosilicate glass, $Al_2O_3$ and SIALON.

14. The thermopile infrared sensor as in claim 1, wherein the metal film layer consists of at least one member selected from the group consisting of Al, Cr, Mo, W and NiCr.

15. The thermopile infrared sensor as in claim 1, wherein the thermopile infrared sensor is enclosed in a package, a window consisting of an infrared-transmissible filter is mounted at an opening formed on a cap of the package, a shape of the window is quadrilateral or hexagonal, the opening fits with the window, and notches formed at each corner of the opening are placed outside compared to intersection points among each side of the quadrilateral or hexagonal.

16. The thermopile infrared sensor as in claim 1, wherein the thermopile infrared sensor is enclosed in a package, a window consisting of an infrared-transmissible filter is mounted at an opening formed on a cap of the package, a shape of the window is quadrilateral or hexagonal, the opening fits with the window, and hollows formed at each corner of the opening position and mount the window.

17. A thermopile infrared sensor, in which thermoelectric elements are formed on a single crystalline silicon substrate containing a cavity therein, comprising:
  a first dielectric film covering the cavity;
  a plurality of n-type polycrystalline silicon layers formed on the first dielectric film, said silicon layers firstly extending radially from a circumference in the vicinity of a chip center and secondly from a plurality of out concentric circles toward a chip periphery
  a second dielectric film covering the n-type polycrystalline silicon layers and the first dielectric film;
  contact holes formed in the second dielectric film; and
  metal film layers formed in contact with the n-type polycrystalline silicon layers through the contact hole,
wherein hot junctions are formed at the chip central side and cold junctions are formed at the chip peripheral side of the n-type polycrystalline silicon layers, respectively, by contacting the n-type polycrystalline silicon layer and the metal film layer through the contact hole, and at least one series of thermoelectric elements is formed on the first dielectric film by connecting alternately and successively, by the metal film layer, said hot junction and cold junction of the neighboring n-type polycrystalline silicon layer, and an infrared absorption film is formed on a dielectric film that covers said series of thermoelectric elements.

18. A thermopile infrared sensor, in which thermoelectric elements are formed on a single crystalline silicon substrate containing a cavity therein, comprising:
  a first dielectric film covering the cavity formed in the single crystalline silicon substrate;
  a plurality of n-type polycrystalline silicon layers formed on the first dielectric film, said silicon layers firstly extending radially from a circumference in the vicinity of a chip center and secondly from a plurality of out concentric circles toward a chip periphery respectively and said formed silicon layers being situated to form a complementary pattern with each other;
  a second dielectric film formed on the n-type polycrystalline silicon layers and the first dielectric film;
  contact holes formed in the second dielectric film;
  metal film layers formed in contact with the n-type polycrystalline silicon layers through the contact holes;
  hot and cold junctions formed at the chip central side and the chip peripheral side of a plurality of the n-type polycrystalline silicon layers, respectively, by contacting the metal film layer and the n-type polycrystalline silicon layer through the contact hole;
  a series of thermoelectric elements formed by connecting alternately and successively said hot junction and cold junction by the metal film layer;
  a third dielectric film formed on the second dielectric film and the metal film layers;
  an infrared absorption film formed on the third dielectric film so as to cover the hot junctions; and
  electrode pads formed at ends of the series of thermoelectric elements.

19. A thermopile infrared sensor, in which thermoelectric elements are formed on a single crystalline silicon substrate containing a cavity therein, comprising:
  a first dielectric film covering the cavity;
  a plurality of n-type polycrystalline silicon layers formed on the first dielectric film, said silicon layers firstly extending radially from a circumference in the vicinity of a chip center and secondly from a plurality of outer concentric circles toward a chip periphery respectively and said formed silicon layers being situated to form a complementary pattern with each other;
  metal film layers formed in contact with the n-type polycrystalline silicon layers;
  hot and cold junctions formed at the chip central side and the chip peripheral side of the n-type polycrystalline silicon layers, respectively, by contacting the n-type polycrystalline silicon layer and the metal film layer;
  a series of thermoelectric elements formed on the first dielectric film, in which the metal film layer connected with the hot junction extends on the first dielectric film and connects with the cold junction on the neighboring n-type polycrystalline silicon layer, thereby connecting the hot junction and the cold junction alternately and successively; and
  an infrared absorption film formed on a second dielectric film that covers the series of thermoelectric elements.

20. A thermopile infrared sensor, in which thermoelectric elements are formed on a single crystalline silicon substrate containing a cavity therein, comprising:
  a first dielectric film covering the cavity;
  a plurality of first n-type polycrystalline silicon layers formed on the first dielectric film, said silicon layers firstly extending radially from a circumference in the vicinity of a chip center and secondly from a plurality of outer concentric circles toward a chip periphery respectively and said formed silicon layers being situated to form a complementary pattern with each other;
  a second dielectric film covering the first n-type polycrystalline silicon layers and the first dielectric film;
  a plurality of second n-type polycrystalline silicon layers formed on the second dielectric film, having the same pattern as a pattern of the first n-type polycrystalline silicon layers but shifted by half of a pitch toward the circumference of a chip;
  a third dielectric film covering the second n-type polycrystalline silicon layers;
  contact holes formed on the second and third dielectric films covering the first and second n-type polycrystalline silicon layers, respectively;
  metal film layers formed in contact with the first and second n-type polycrystalline silicon layers through the contact hole;
  hot and cold junctions formed at the chip central side and the chip peripheral side, respectively, of the first and second n-type polycrystalline silicon layers by contacting the first and second n-type polycrystalline silicon layers and the metal film layer through the contact hole;
  a series of thermoelectric elements formed by connecting alternately and successively said hot junction and cold junction of the neighboring n-type polycrystalline silicon layer by the metal film layer; and
  an infrared absorption film formed on a dielectric film that covers the series of thermoelectric elements.

21. A process for producing a thermopile infrared sensor comprising the steps of:
  forming a first dielectric film on both sides of a single crystalline silicon substrate by thermal oxidation, chemical vapor deposition or sputtering;

depositing a polycrystalline silicon layer on the first dielectric film by chemical vapor deposition or sputtering;

forming a n-type polycrystalline silicon layer having resistivity of 1 to 10 mΩ·cm by diffusing impurities into the polycrystalline silicon layer;

patterning the n-type polycrystalline silicon layer so as to have a set of patterns consisting of patterns radially extending in striped shape from a fan-shaped pattern formed between radii $r_1$ and $r_2$ around a chip center up to the vicinity of a periphery of the substrate, patterns radially extending in striped shape toward outside from $r_2$ up to the vicinity of the periphery of the substrate, and patterns radially extending in striped shape toward outside from $r_3$ up to the vicinity of the periphery of the substrate;

forming a second dielectric film on a plurality of the patterned n-type polycrystalline silicon layers and the first dielectric film by chemical vapor deposition, glass coating or sputtering;

forming contact holes on the second dielectric film at which hot and cold junctions to be formed;

depositing a metal film layer by sputtering or vacuum evaporation after forming the contact holes;

patterning the metal film layer, then making ohmic contact between the n-type polycrystalline silicon layers and the metal film layers at the contact holes and then, forming a series of thermoelectric elements by connecting each thermoelectric element consisting of a pair of hot and cold junctions in series;

forming a third dielectric film on the metal film layers and on the second dielectric film and forming an infrared absorption film at the chip center; and forming an opening in the first dielectric film formed on the back of the single crystalline silicon substrate, followed by forming a cavity in the back of the single crystalline silicon substrate by etching and then, followed by exposing the first dielectric film from the back of the single crystalline silicon substrate.

22. The process for producing a thermopile infrared sensor as in claim 21, wherein the infrared absorption film formed on the series of thermoelectric elements consists of one member selected from the group consisting of borosilicate glass, polyimide resin, vinyl resin and acrylic resin.

23. The process for producing a thermopile infrared sensor as in claim 21, further comprising a step of baking the infrared absorption film so as to make a surface thereof have an uneven striped pattern.

24. The process for producing a thermopile infrared sensor according to claim 22, wherein a thickness of the infrared absorption film is 1 to 15 μm is formed on a surface of the infrared absorption film.

25. A process for producing a thermopile infrared sensor comprising the steps of:

forming a first dielectric film on both sides of a single crystalline silicon substrate by thermal oxidation, chemical vapor deposition or sputtering;

depositing a polycrystalline silicon layer on the first dielectric film by chemical vapor deposition or sputtering;

forming a n-type polycrystalline silicon layer having resistivity of 1 to 10 mΩ·cm by diffusing impurities into the polycrystalline silicon layer;

patterning the n-type polycrystalline silicon layer so as to have a set of patterns consisting of patterns radially extending in striped shape from a fan-shaped pattern formed between radii $r_1$ and $r_2$ around a chip center up to the vicinity of a periphery of the substrate, patterns radially extending in striped shape toward outside from $r_2$ up to the vicinity of the periphery of the substrate, and patterns radially extending in striped shape toward outside from $r_3$ up to the vicinity of the periphery of the substrate, and the, a part of thus patterned n-type polycrystalline silicon layers is etched so as to have mesa shape;

patterning by using a pattern that is larger than the pattern of said mesa shape n-type polycrystalline silicon layers but similar in shape, followed by etching with the exception of the n-type polycrystalline silicon layers situated near the periphery of said mesa shape n-type polycrystalline silicon layers, thereby forming a tapered and step shaped n-type polycrystalline silicon layers;

forming a second dielectric film on said step shaped n-type polycrystalline silicon layers, then forming contact holes on the second dielectric film at which hot and cold junctions to be formed;

forming a metal film layer by sputtering or vacuum evaporation;

patterning the metal film layer, then making ohmic contact between said step-like shaped n-type polycrystalline silicon layers and the metal film layers at the contact holes and then, forming a series of thermoelectric elements by connecting each thermoelectric element consisting of a pair of hot and cold junctions in series;

forming a third dielectric film on the metal film layers and the second dielectric film, then forming an infrared absorption film on the third dielectric film; and forming a cavity in the back of the single crystalline silicon substrate, then exposing the first dielectric film from the back of the single crystalline silicon substrate.

26. A process for producing a thermopile infrared sensor comprising the steps of:

forming a first dielectric film on both sides of a single crystalline silicon substrate by thermal oxidation, chemical vapor deposition or sputtering;

depositing a first polycrystalline silicon layer on the first dielectric film by chemical vapor deposition or sputtering;

patterning the first polycrystalline silicon layer so as to have a first pattern consisting of patterns radially extending in striped shape from a fan-shaped pattern formed between radii $r_1$ and $r_2$ around a chip center up to the vicinity of a periphery of the substrate, patterns radially extending in striped shape toward outside from $r_2$ up to the vicinity of the periphery of the substrate and patterns radially extending in striped shape toward outside from $r_3$ up to the vicinity of the periphery of the substrate, then depositing a second polycrystalline silicon layer and then, forming a first n-type polycrystalline silicon layer having said first pattern and a second n-type polycrystalline silicon layer, both having resistivity of 1 to 10 mΩ·cm, by doping impurities;

patterning the second n-type polycrystalline silicon layer by using a second pattern that is larger than said first pattern but similar in shape, thereby forming the periphery of n-type polycrystalline silicon layers formed by using said second pattern to be tapered and step-shaped;

forming a second dielectric film on the n-type polycrystalline silicon layers formed by using said second pattern, then forming contact holes on the second dielectric film at which hot and cold junctions to be formed;

forming a metal film layer by sputtering or vacuum evaporation;

patterning the metal film layer, then making ohmic contact between the n-type polycrystalline silicon layers and the metal film layers at the contact holes and then, forming a series of thermoelectric elements by connecting each thermoelectric element consisting of a pair of hot and cold junctions in series;

forming a third dielectric film on the metal film layers and the second dielectric film, then forming an infrared absorption film on the third dielectric film; and forming a cavity in the back of the single crystalline silicon substrate, then exposing the first dielectric film from the back of the single crystalline silicon substrate.

27. A process for producing a thermopile infrared sensor comprising the steps of:

forming a first dielectric film on both sides of a single crystalline silicon substrate by thermal oxidation, chemical vapor deposition or sputtering;

depositing a first polycrystalline silicon layer on the first dielectric film by chemical vapor deposition or sputtering;

forming a first n-type polycrystalline silicon layer having resistivity of 1 to 10 mΩ·cm by diffusing impurities into the first polycrystalline silicon layer;

patterning the first n-type polycrystalline silicon layer so as to have a first pattern consisting of patterns radially extending in striped shape from a fan-shaped pattern formed between radii $r_1$ and $r_2$ around a chip center up to the vicinity of a periphery of the substrate, patterns radially extending in striped shape toward outside from $r_2$ up to the vicinity of the periphery of the substrate, and patterns radially extending in striped shape toward outside from $r_3$ up to the vicinity of the periphery of the substrate;

forming a second dielectric film on a plurality of the patterned first n-type polycrystalline silicon layers and on the first dielectric film by chemical vapor deposition, glass coating or sputtering;

depositing a second polycrystalline silicon layer on the second dielectric film, then doping the second polycrystalline silicon layer with impurities, thereby forming a second n-type polycrystalline silicon layer having resistivity of 1 to 10 mΩ·cm;

patterning the second n-type polycrystalline silicon layer so as to have a second pattern that is the same pattern in shape as the first pattern of the first n-type polycrystalline silicon layers but shifted by half of a pitch toward the circumference of a chip;

forming a third dielectric film on the patterned first and second n-type polycrystalline silicon layers, then forming contact holes on the second or third dielectric film at which hot and cold junctions to be formed;

forming a metal film layer on the third dielectric film;

patterning the metal film layer, then making ohmic contact between the first and second n-type polycrystalline silicon layers and the metal film layers at the contact holes and then, forming a series of thermoelectric elements by connecting each thermoelectric element consisting of a pair of hot and cold junctions in series;

forming a fourth dielectric film on the metal film layers and the third dielectric film, then forming an infrared absorption film on the fourth dielectric film; and forming a cavity in the back of the single crystalline silicon substrate, then exposing the first dielectric film from the back of the single crystalline silicon substrate.

28. A process for producing a thermopile infrared sensor comprising the steps of:

forming a first dielectric film on both sides of a single crystalline silicon substrate by thermal oxidation, chemical vapor deposition or sputtering;

depositing a polycrystalline silicon layer on the first dielectric film by chemical vapor deposition or sputtering;

forming a n-type polycrystalline silicon layer having resistivity of 1 to 10 mΩ·cm by diffusing impurities into the polycrystalline silicon layer;

patterning the n-type polycrystalline silicon layer so as to have a set of patterns consisting of patterns radially extending in striped shape from a fan-shaped pattern formed between radii $r_1$ and $r_2$ around a chip center up to the vicinity of a periphery of the substrate, patterns radially extending in striped shape toward outside from $r_2$ up to the vicinity of the periphery of the substrate, and patterns radially extending in striped shape toward outside from $r_3$ up to the vicinity of the periphery of the substrate;

forming a metal film layer on the first dielectric film and the patterned n-type polycrystalline silicon layers;

patterning the metal film layer, then making ohmic contact between the n-type polycrystalline silicon layers and the metal film layers so as to form hot and cold junctions and then, forming a series of thermoelectric elements by connecting each thermoelectric element consisting of a pair of hot and cold junctions in series through the metal film layer;

forming a second dielectric film on the first dielectric film, the metal film layers and the patterned n-type polycrystalline silicon layers, then forming an infrared absorption film on the second dielectric film at a chip center; and forming a cavity in the back of the single crystalline silicon substrate by etching, then exposing the first dielectric film from the back of the signal crystalline silicon substrate.

* * * * *